US012021296B2

(12) United States Patent
Yoo et al.

(10) Patent No.: US 12,021,296 B2
(45) Date of Patent: Jun. 25, 2024

(54) ELECTRONIC DEVICE INCLUDING ANTENNA

(71) Applicant: Samsung Electronics Co., Ltd., Gyeonggi-do (KR)

(72) Inventors: Jangsun Yoo, Gyeonggi-do (KR); Jingyu Choi, Gyeonggi-do (KR); Jongmyung Kim, Gyeonggi-do (KR); Jihye Moon, Gyeonggi-do (KR); Cheehwan Yang, Gyeonggi-do (KR); Kwangyong Lee, Gyeonggi-do (KR); Myeonggil Lee, Gyeonggi-do (KR); Seungwoon Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 211 days.

(21) Appl. No.: 17/438,976

(22) PCT Filed: Mar. 13, 2020

(86) PCT No.: PCT/KR2020/003563
§ 371 (c)(1),
(2) Date: Sep. 14, 2021

(87) PCT Pub. No.: WO2020/189986
PCT Pub. Date: Sep. 24, 2020

(65) Prior Publication Data
US 2022/0069437 A1   Mar. 3, 2022

(30) Foreign Application Priority Data

Mar. 15, 2019  (KR) ........................ 10-2019-0030140

(51) Int. Cl.
*H01Q 1/22*    (2006.01)
*H01Q 1/48*    (2006.01)
*H01Q 21/28*   (2006.01)

(52) U.S. Cl.
CPC ................. *H01Q 1/2266* (2013.01)

(58) Field of Classification Search
CPC ............ H01Q 5/378; H01Q 7/00; H01Q 9/00; H01Q 9/065; H01Q 1/2208; H01Q 1/2291;
(Continued)

(56) References Cited

U.S. PATENT DOCUMENTS 8,976,524 B2   3/2015   Wang et al.
9,559,406 B2   1/2017   Guterman et al.
(Continued)

FOREIGN PATENT DOCUMENTS

CN        202949041 U    5/2013
KR    10-2006-0029616 A   4/2006
(Continued)

OTHER PUBLICATIONS

Korean Office Action dated Mar. 7, 2024.

*Primary Examiner* — Wei (Victor) Y Chan
(74) *Attorney, Agent, or Firm* — Cha & Reiter, LLC

(57) ABSTRACT

According to an embodiment, an electronic device may comprise: a first housing structure comprising a first surface facing in a first direction, a second surface facing in a second direction opposite to the first direction, a first side surface and a second side surface facing opposite to each other and surrounding at least a part of the space between the first surface and the second surface, and a third side surface and a fourth side surface facing opposite to each other while being perpendicular to the first side surface; a second housing structure comprising a third surface facing in a third direction, a fourth surface facing in a fourth direction opposite to the third direction, a fifth side surface and a sixth side surface facing opposite to each other and surrounding at least a part of the space between the third surface and the fourth surface, and a seventh side surface and an eighth side surface facing opposite to each other while being perpendicular to the fifth side surface; a hinge structure connecting between the first side surface and the fifth side surface; a display disposed along at least a part of the third surface; at least one antenna disposed near the first side surface inside the first housing structure; and at least one wireless communication module configured to transmit and/or receive a signal in a selected or designated frequency band through the at least one antenna. Various other embodiments may be possible.

12 Claims, 19 Drawing Sheets

(58) Field of Classification Search
CPC . H01Q 3/00; H01Q 1/00; H01Q 11/00; H01Q 13/00; H01Q 15/00; H01Q 17/00; H01Q 19/00; H01Q 21/00; H01Q 23/00; H01Q 25/00

See application file for complete search history.

(56) References Cited

U.S. PATENT DOCUMENTS

| | | |
|---|---|---|
| 9,680,202 B2 | 6/2017 | Irci et al. |
| 10,249,933 B2 | 4/2019 | Moon et al. |
| 11,075,443 B2 | 7/2021 | Yoo et al. |
| 2004/0257283 A1* | 12/2004 | Asano ............... H01Q 21/28 343/702 |
| 2010/0321255 A1 | 12/2010 | Kough et al. |
| 2014/0097993 A1* | 4/2014 | Hotta ............... H01Q 1/48 343/702 |
| 2014/0361932 A1* | 12/2014 | Irci ............... H01Q 1/2266 343/702 |
| 2016/0261022 A1 | 9/2016 | Guterman et al. |
| 2017/0201013 A1 | 7/2017 | Choi et al. |
| 2017/0373374 A1* | 12/2017 | Moon ............... H01Q 1/24 |
| 2018/0026331 A1 | 1/2018 | Chang et al. |
| 2018/0184545 A1 | 6/2018 | Degner et al. |

FOREIGN PATENT DOCUMENTS

| | | |
|---|---|---|
| KR | 10-2008-0017857 A | 2/2008 |
| KR | 10-2017-0083900 A | 7/2017 |
| KR | 10-2018-0001204 A | 1/2018 |

\* cited by examiner

ELECTRONIC DEVICE INCLUDING ANTENNA

CROSS REFERENCE TO RELATED APPLICATIONS

This application is a National Phase Entry of PCT International Application No. PCT/KR2020/003563, which was filed on Mar. 13, 2020, and claims a priority to Korean Patent Application No. 10-2019-0030140, which was filed on Mar. 15, 2019, the contents of which are incorporated herein by reference.

TECHNICAL FIELD

Various embodiments relate to an electronic device including an antenna.

BACKGROUND ART

As electronic communication technologies are developed, electronic devices having various functions are appearing. These electronic devices can have a convergence function of complicatedly performing one or more functions. Recently, as a functional difference is noticeably decreased every manufacturing company, the electronic devices strengthen a design aspect and simultaneously get slimmer in order to satisfy a purchase desire of a consumer.

DISCLOSURE OF INVENTION

Technical Problem

The electronic device can include an antenna for transmitting and/or receiving a wireless signal. However, because a space for disposing the antenna gets narrow owing to the slimming of the electronic device, it can be difficult to dispose the antenna in a narrow internal space within a housing without having electrical influence from another electrical element. Also, because the number of antennas is being increased for the sake of high-speed wireless communication, the disposing of the antenna can be more difficult. Also, the electronic device can include a housing of metal materials for the sake of durability and beauty, and this housing of metal materials can deteriorate antenna radiation performance in a selected or designated frequency band.

Various embodiments can present an electronic device including an antenna, for securing antenna radiation performance while efficiently disposing at least one antenna in a limited internal space of a housing.

Solution to Problem

According to an embodiment, an electronic device can include a first housing structure comprising a first surface oriented in a first direction, a second surface oriented in a second direction opposite to the first direction, a first side surface and a second side surface surrounding at least a portion of the space between the first surface and the second surface and oriented opposite to each other, and a third side surface and a fourth side surface being perpendicular to the first side surface and oriented opposite to each other, and a second housing structure comprising a third surface oriented in a third direction, a fourth surface oriented in a fourth direction opposite to the third direction, a fifth side surface and a sixth side surface surrounding at least a portion of the space between the third surface and the fourth surface and oriented opposite to each other, and a seventh side surface and an eighth side surface being perpendicular to the fifth side surface and oriented opposite to each other, and a hinge structure connecting between the first side surface and the fifth side surface, and a display disposed along at least a portion of the third surface, and at least one antenna disposed near the first side surface inside the first housing structure, and at least one wireless communication module configured to transmit and/or receive a signal in a selected or specified frequency band through the at least one antenna.

Advantageous Effects of Invention

Various embodiments can not only dispose at least one antenna together with another element in a limited internal space of a housing by increasing space efficiency, but also can secure antenna radiation performance.

An effect obtainable or expected from other various embodiments is directly or suggestively disclosed in a detailed description of various embodiments. For instance, various effects expected according to various embodiments will be disclosed in a detailed description described later.

BEST MODE FOR CARRYING OUT THE INVENTION

Various embodiments of the present document are mentioned below with reference to the accompanying drawings.

Figure 1:
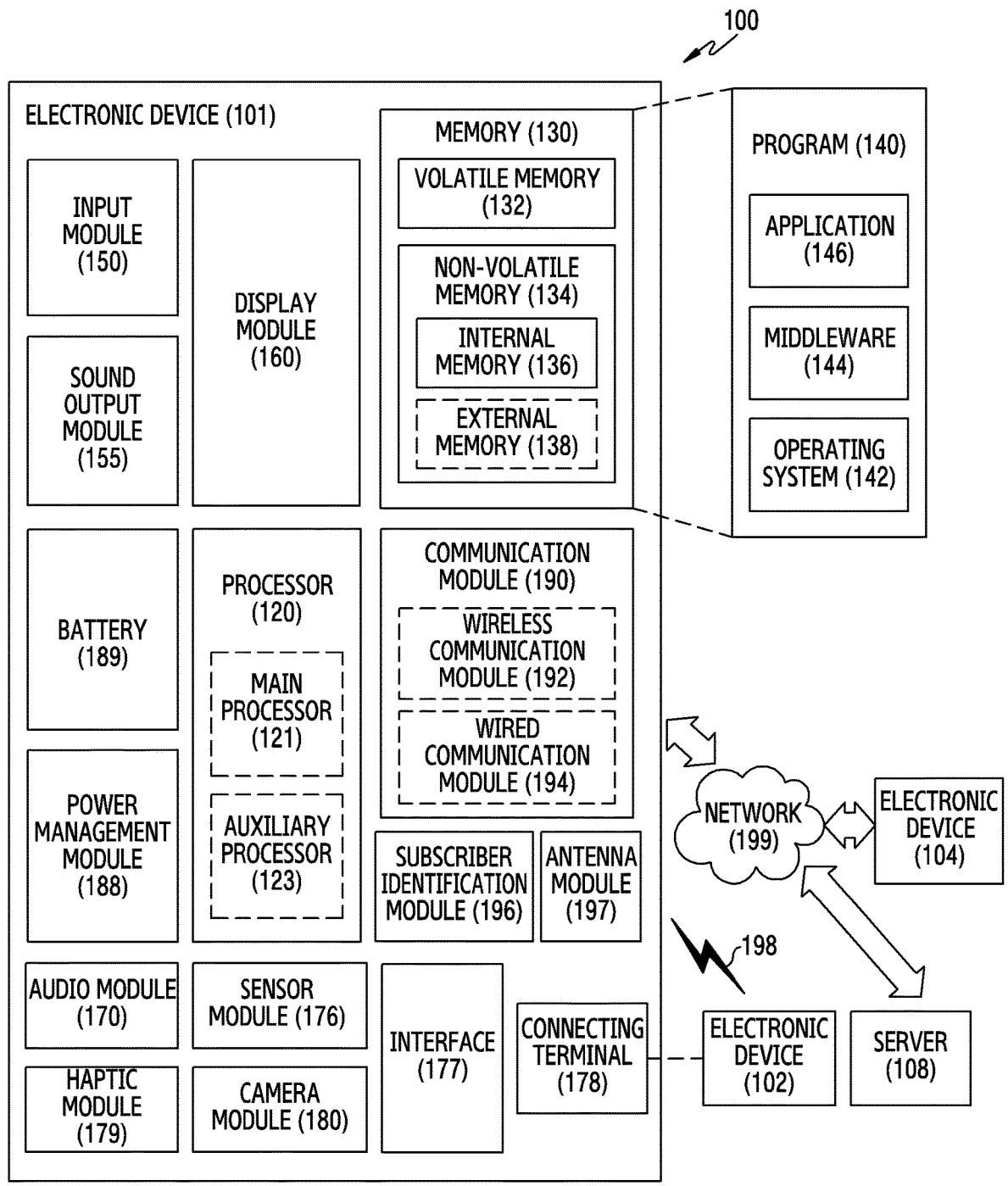
FIG. 1 is a block diagram of an electronic device within a network environment according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
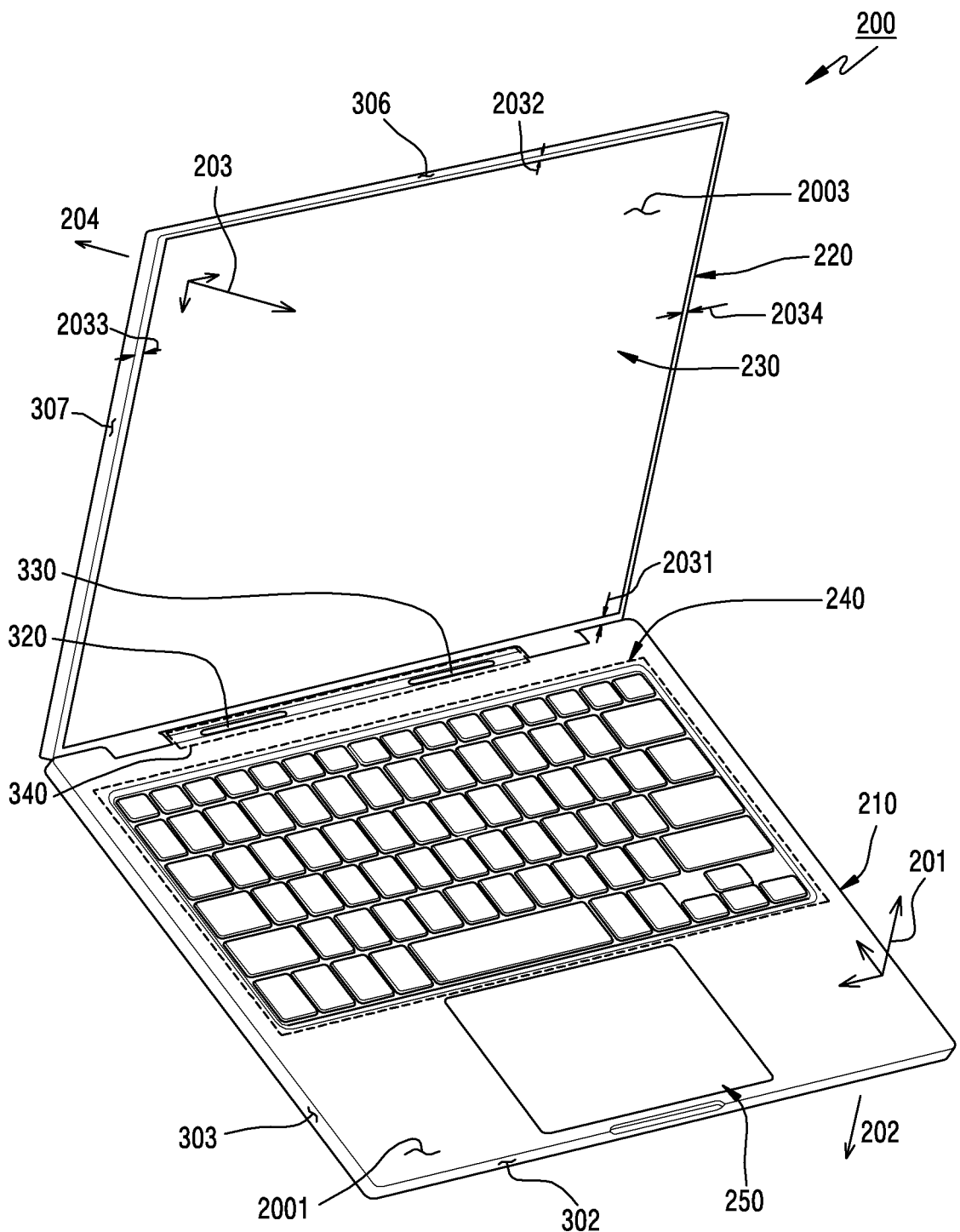
FIG. 2 illustrates an unfolded state of an electronic device according to an embodiment.
Figure 3:
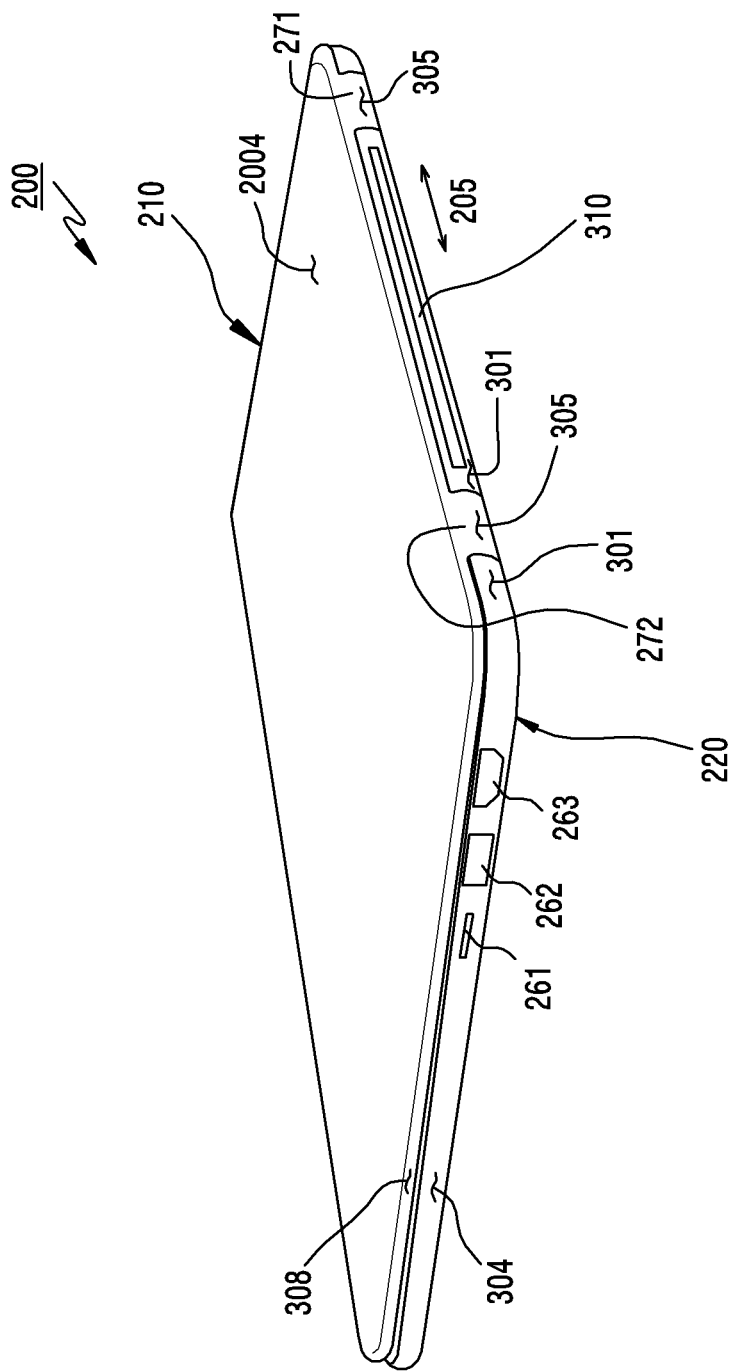
FIG. 3 illustrates a folded state of an electronic device according to an embodiment.

FIG. 2 illustrates an unfolded state of an electronic device according to an embodiment. FIG. 3 illustrates a folded state of the electronic device according to an embodiment.

Referring to FIG. 2 and FIG. 3, in an embodiment, the electronic device 200 can include a first housing structure 210, a second housing structure 220, a display 230, a keyboard 240, a touch pad 250, connector holes 261, 262 and 263, a first opening 310, a second opening 320 or a third opening 330. According to an embodiment, the electronic device 200 can be a laptop computer (or a notebook computer). According to various embodiments, the electronic device 200 can be foldable devices of other various forms.

According to an embodiment, the first housing structure 210 can be rotatably connected with the second housing structure 220 by a hinge structure (not shown). According to various embodiments, a housing including the first housing structure 210, the second housing structure 220, and the hinge structure can be called a foldable housing.

According to an embodiment, the first housing structure 210 can include a first surface 2001 oriented in a first direction 201, a second surface (not shown) oriented in a second direction 202 opposite to the first direction 201, and a first side surface 301, a second side surface 302, a third side surface 303 or a fourth side surface 304 surrounding at least a portion of the space between the first surface 2001 and the second surface 2002. The first side surface 301 and the second side surface 302 can be disposed at mutually opposite sides, and the third side surface 303 and the fourth side surface 304 can be disposed at mutually opposite sides. The third side surface 303 can be vertical with the first side surface 301 or the second side surface 302. The fourth side surface 304 can be vertical with the first side surface 301 or the second side surface 302.

According to an embodiment, the second housing structure 220 can include a third surface 2003 oriented in a third direction 203, a fourth surface 2004 oriented in a fourth direction 204 opposite to the third direction 203, and a fifth side surface 305, a sixth side surface 306, a seventh side surface 307 or an eighth side surface 308 surrounding at least a portion of the space between the third surface 2003 and the fourth surface 2004. The fifth side surface 305 and the sixth side surface 306 can be disposed at mutually opposite sides, and the seventh side surface 307 and the eighth side surface 308 can be disposed at mutually opposite sides. The seventh side surface 307 can be vertical with the fifth side surface 305 or the sixth side surface 306. The eighth side surface 308 can be vertical with the fifth side surface 305 or the sixth side surface 306.

According to an embodiment, in the folded state (e.g., referring to FIG. 3) of the electronic device 200, the first surface 2001 of the first housing structure 210 and the third surface 2003 of the second housing structure 220 can face each other. For example, in the folded state of the electronic device 200, the first surface 2001 and the third surface 2003 can form a first angle of about 0 degree to 10 degree. According to various embodiments (not shown), in the folded state of the electronic device 200, the second surface 2002 and the fourth surface 2004 can face each other.

According to an embodiment, in the unfolded state (e.g., referring to FIG. 2) of the electronic device 200, the first surface 2001 of the first housing structure 210 and the third surface 2003 of the second housing structure 220 can form a second angle greater than the first angle. According to various embodiments (not shown), the electronic device 200 can be unfolded wherein the first surface 2001 and the third surface 2003 form an angle of about 180 degree while being oriented in the same direction (e.g., the first direction 201 or the third direction 202).

According to an embodiment, the first side surface 301 of the first housing structure 210 and/or the fifth side surface 305 of the second housing structure 220 can be disposed in adjacent to the hinge structure or be included in the hinge structure and be at least partially exposed to the external in the unfolded state (referring to FIG. 2) or the folded state (referring to FIG. 3) of the electronic device 200.

According to an embodiment, in the folded state (referring to FIG. 3) of the electronic device 200, the sixth side surface 306 can be aligned with the second side surface 302, to form the one side surface of the electronic device 200 together. In the folded state of the electronic device 200, the seventh side surface 307 can be aligned with the third side surface 303, to form the one side surface of the electronic device 200 together. In the folded state of the electronic device 200, the eighth side surface 308 can be aligned with the fourth side surface 304, to form the one side surface of the electronic device 200 together.

In various embodiments (not shown), the first housing structure 210 can denote a structure which forms at least some of the first surface 2001, the second surface 2002, the first side surface 301, the second side surface 302, the third side surface 303, and the fourth side surface 304. For example, the first housing structure 210 can include a case (or a frame) (not shown) which forms the first surface 2001, the first side surface 301, the second side surface 302, the third side surface 303 and the fourth side surface 304, and a back cover (not shown) which forms at least a portion of the second surface 2002.

In various embodiments (not shown), the second housing structure 220 can denote a structure which forms at least some of the third surface 2003, the fourth surface 2004, the fifth side surface 305, the sixth side surface 306, the seventh side surface 307, and the eighth side surface 308.

According to various embodiments, at least a portion of the first housing structure 210 or the second housing structure 220 can be formed of a coated or colored glass, a ceramic, polymer, a metal (e.g., aluminum, a steel type stainless (STS) or magnesium), or a combination of at least two of the materials.

The display 230, for example, can be disposed inside the second housing structure 220. The display 230 can be disposed at least partially along the third surface 2003, and can be exposed through the third surface 2003. According to various embodiments, the display 230 can be combined with, or be disposed in adjacent with, a touch sensing circuit, a pressure sensor capable of measuring a touch strength (pressure), and/or a digitizer obtaining a magnetic-type stylus pen.

According to an embodiment, when viewed from above the third surface 2003, the second housing structure 220 can include a frame portion (or an edge portion) (e.g., bezels 2031, 2032, 2033 and 2034) surrounding the display 230. For example, when viewed from above the third surface 2003, widths of the frame portions 2031, 2032, 2033 and 2034 can be about 10 mm or less. For example, when viewed from above the third surface 2003, a rate of being occupied by the display 230 among the third surface 2003 can be about 90% or more (e.g., a bezel-less display or a full screen display).

The keyboard 240, for example, can be disposed in the first housing structure 210. According to an embodiment, the first housing structure 210 can include a plurality of through-holes (not shown) formed in the first surface 2001, and a plurality of buttons of the keyboard 240 can be disposed in the plurality of through-holes.

The touch pad 250, for example, can be disposed between the keyboard 240 and the second side surface 302 when viewed from above the first surface 2001. The touch pad 250 is a pointing device exposed as a portion of the first surface 2001, and can have a built-in sensor in a surface. For example, in response to a finger touching the touch pad 250, a sensor of the portion can sense a variation of capacitance and forward this to the electronic device 200. According to various embodiments, a click button can be in a rear surface of the touch pad 250, and in response to this being pressed, an input as if a mouse button is clicked can be provided.

According to various embodiments (not shown), the electronic device 200 can include one or more key input devices (e.g., push buttons) disposed in the side surfaces 301, 302, 303 and 304 of the first housing structure 210, the side surfaces 305, 306, 307 and 308 of the second housing structure 220, or the first surface 2001. According to various embodiments, all or some of the key input devices may not included, and the key input devices not included can be implemented in other forms such as a soft key on the display 230. In some embodiment, the key input device can include a sensor module disposed in the first housing structure 210 or the second housing structure 220.

According to various embodiments (not shown), the electronic device 200 can include an audio module. The audio module can include a microphone hole or a speaker hole. The microphone hole can dispose a microphone for acquiring an external sound therein and, in an embodiment, can dispose a plurality of microphones wherein the direction of sound can be sensed. The speaker hole can include an external speaker hole or a calling receiver hole. In an embodiment, the speaker hole and the microphone hole can be implemented as one hole, or a speaker can be included without the speaker hole (e.g., a piezo speaker).

According to various embodiments (not shown), the electronic device 200 can include at least one of various sensors such as a proximity sensor disposed in the first housing structure 210 or the second housing structure 220, a front camera, a light emitting element or a receiver. For example, the light emitting element can present state information of the electronic device 200 in a light form. In another embodiment, the light emitting element, for example, can present a light source interlocked with an operation of the front camera. The light emitting element, for example, can include an LED, an IR LED and a xenon lamp.

According to various embodiments, the electronic device 200 can include the connector holes 261, 262 and 263 formed in the first housing structure 210. The connector hole 261, 262 or 263 can include a first connector hole capable of accessing a connector (for example, a USB connector) for transmitting and/or receiving power and/or data with an external electronic device, a second connector hole (for example, an earphone jack) capable of accessing a connector for transmitting and/or receiving an audio signal with the external electronic device, or a third connector hole capable of accessing a memory card. A location, or the number, of the connector hole is not limited to an example shown in FIG. 3 and can be formed differently.

According to an embodiment, the electronic device 200 can include a heat sink structure for externally releasing a heat radiated from at least one part disposed inside the first housing structure 210. The heat sink structure can prevent the at least one part from being overheated. For example, the at least one part can include a resistance component and, in response to the at least one part consuming an electric current, one portion of the electric current can be changed into heat energy by this resistance component and radiated. The at least one part can be distinguished from a part which is prepared to radiate a heat intentionally. For example, a heat can be radiated from a plurality of ICs (e.g., a processor) included in a printed circuit board (not shown) disposed in the first housing structure 210, or power sources.

According to an embodiment, the first opening 310 can be formed in the first surface 301 of the first housing structure 210. The heat sink structure can allow a heat radiated from the at least one part disposed inside the first housing structure 210 to be released externally through the first opening 310.

According to an embodiment, the heat sink structure can include a heat conducting member disposed inside the first housing structure 210 and transferring a heat radiated from the at least one part towards the first opening 310.

According to an embodiment, the heat sink structure can include a blower disposed inside the first housing structure 210 and inducing a flow of air. The blower can be connected with a portion of the heat conducting member and, by the blower, air can be released externally through the first opening 310 via the portion of the heat conducting member. A pressure difference between inside and outside the first housing structure 210 caused by the flow of air by the blower can allow an external air (the air) to be introduced (or inhaled) into the first housing structure 210 through the first opening 310. Because of a forced convection by the blower, convection heat transfer performance between the heat conducting member and air can be increased.

According to an embodiment, the first opening 310 can be formed in the form of being long extended in the fifth direction 205 between the third side surface 303 and the fourth side surface 304. According to various embodiments (not shown), the first opening 310 can be replaced with a plurality of openings as well.

According to an embodiment, the electronic device 200 can include at least one antenna disposed inside the first housing structure 210. The at least one antenna can be electrically connected with a wireless communication module (e.g., the wireless communication module 192 of FIG. 1) and transmit and/or receive a signal having a selected or specified frequency. For example, the at least one antenna can be disposed in a support member (not shown) of non-conductive materials (e.g., polymer) disposed inside the first housing structure 210.

According to an embodiment, the support member can be a carrier for antenna disposition.

According to an embodiment, the support member can include a plurality of through-holes. The plurality of through-holes of the support member can be aligned with the first opening 310. Also, air can pass through the plurality of through-holes of the support member between inside and outside the first housing structure 210.

According to an embodiment, the at least one antenna can be disposed facing the first surface 2001 of the first housing structure 210. According to an embodiment, the first housing structure 210 can include a first plate (not shown) forming the first surface 2001. The first plate can be formed of metal materials. According to an embodiment, when viewed from above the first surface 2001, the first plate can include the second opening 320 and/or the third opening 330 at least partially overlapping with the at least one antenna. According to an embodiment, the second opening 320 and/or the third opening 330 can reduce the deterioration of antenna radiation performance of the at least one antenna caused by the first plate of metal. For example, the second opening 320 and/or the third opening 330 can decrease an electrical influence (or electrical interference) that the first plate of metal forming the first surface 2001 has on electromagnetic wave energy (or electric field) released from the at least one antenna.

According to various embodiments, because the first plate of metal is disposed facing the at least one antenna, capacitance (or a capacitance component or a parasitic capacitance component) can be provided, and a parasitic resonance frequency caused by the capacitance can be formed.

According to an embodiment, the second opening 320 and/or the third opening 330 can adjust the parasitic resonance frequency wherein the parasitic resonance frequency is not included in a resonance frequency band of the at least one antenna. Owing to the second opening 320 and/or the third opening 330, the parasitic resonance frequency can move out of the resonance frequency band of the at least one antenna, and this can cause a decrease of the deterioration of antenna radiation performance caused by the parasitic resonance frequency.

According to various embodiments, a portion 340 of the first plate including the second opening 320 and/or the third opening 330 can operate as an additional antenna radiator capable of transmitting and/or receiving a signal having a selected or specified frequency together with the at least one antenna. For example, the portion 340 of the first plate including the second opening 320 and/or the third opening 330 can operate as a slot antenna radiator electromagnetically coupled with the at least one antenna. According to an embodiment, the at least one antenna can be utilized as a feeding structure, and the portion 340 of the first plate including the second opening 320 and/or the third opening 330 can indirectly receive an emission current (or a wireless signal) from the feeding structure.

Figure 4:
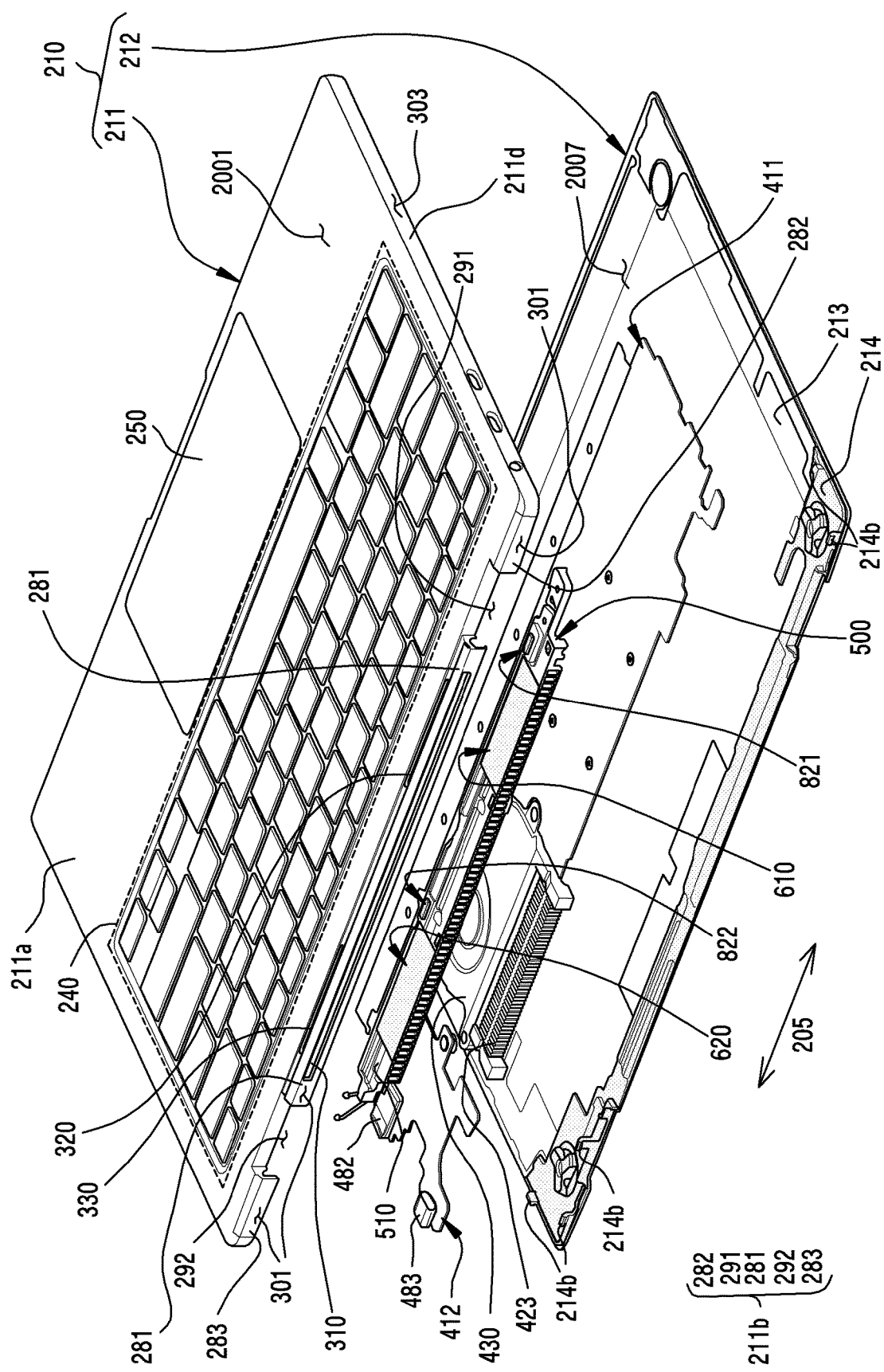
FIG. 4 is an exploded perspective view of the electronic device of FIG. 2 according to an embodiment.
Figure 5:
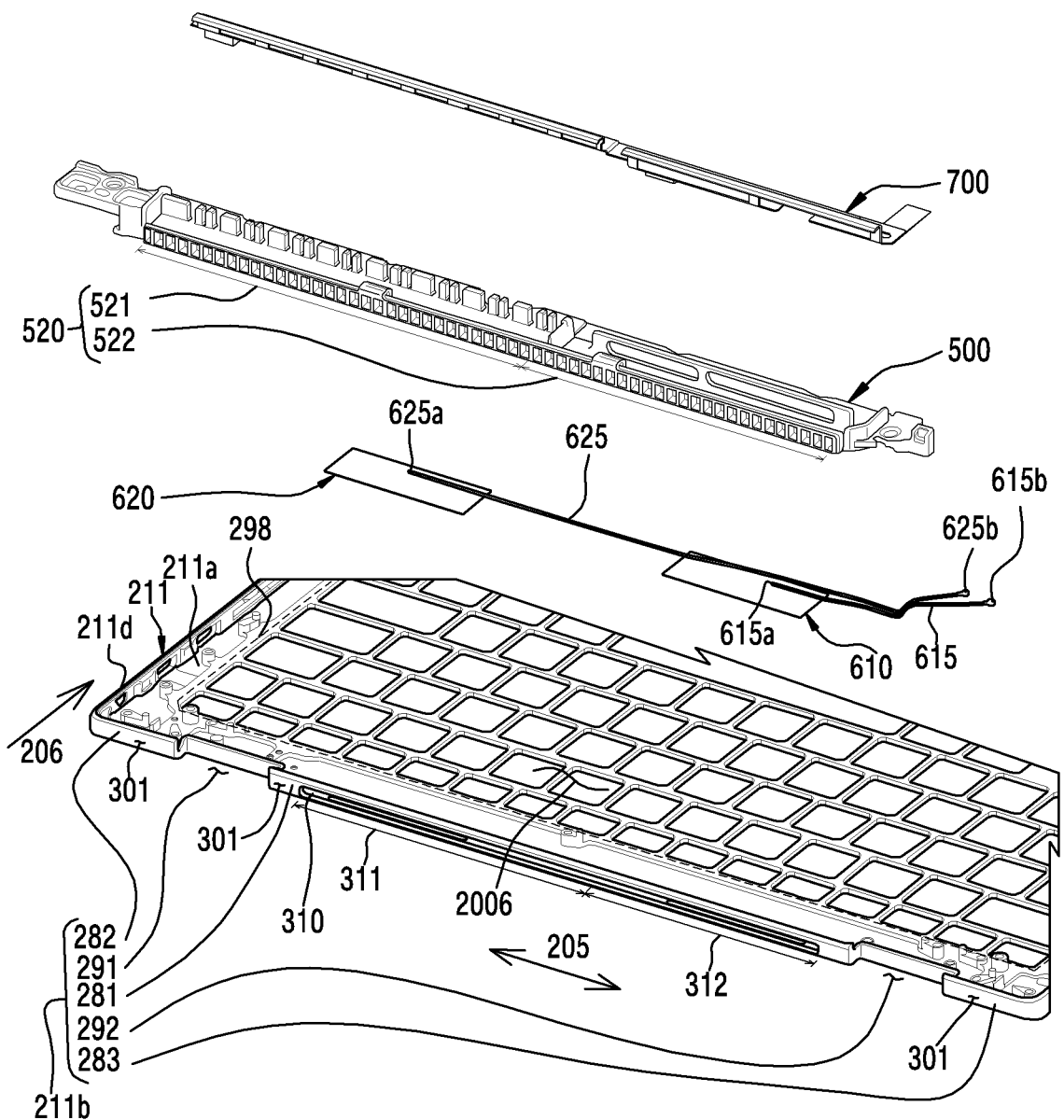
FIG. 5 is an exploded perspective view of the electronic device of FIG. 2 according to an embodiment.
Figure 6:
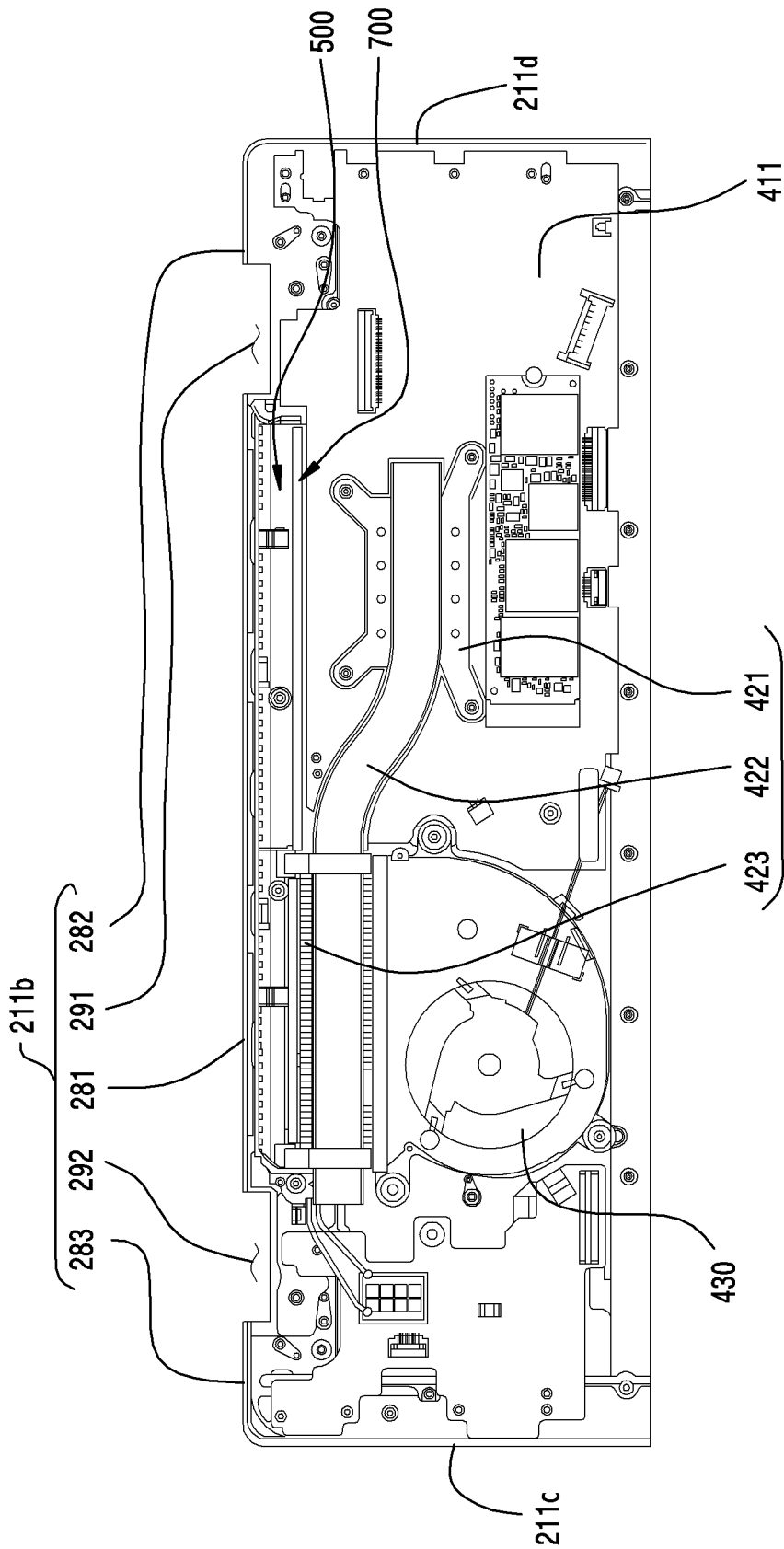
FIG. 6 is a diagram of a heat sink structure of the electronic device of FIG. 2 according to an embodiment.
Figure 7:
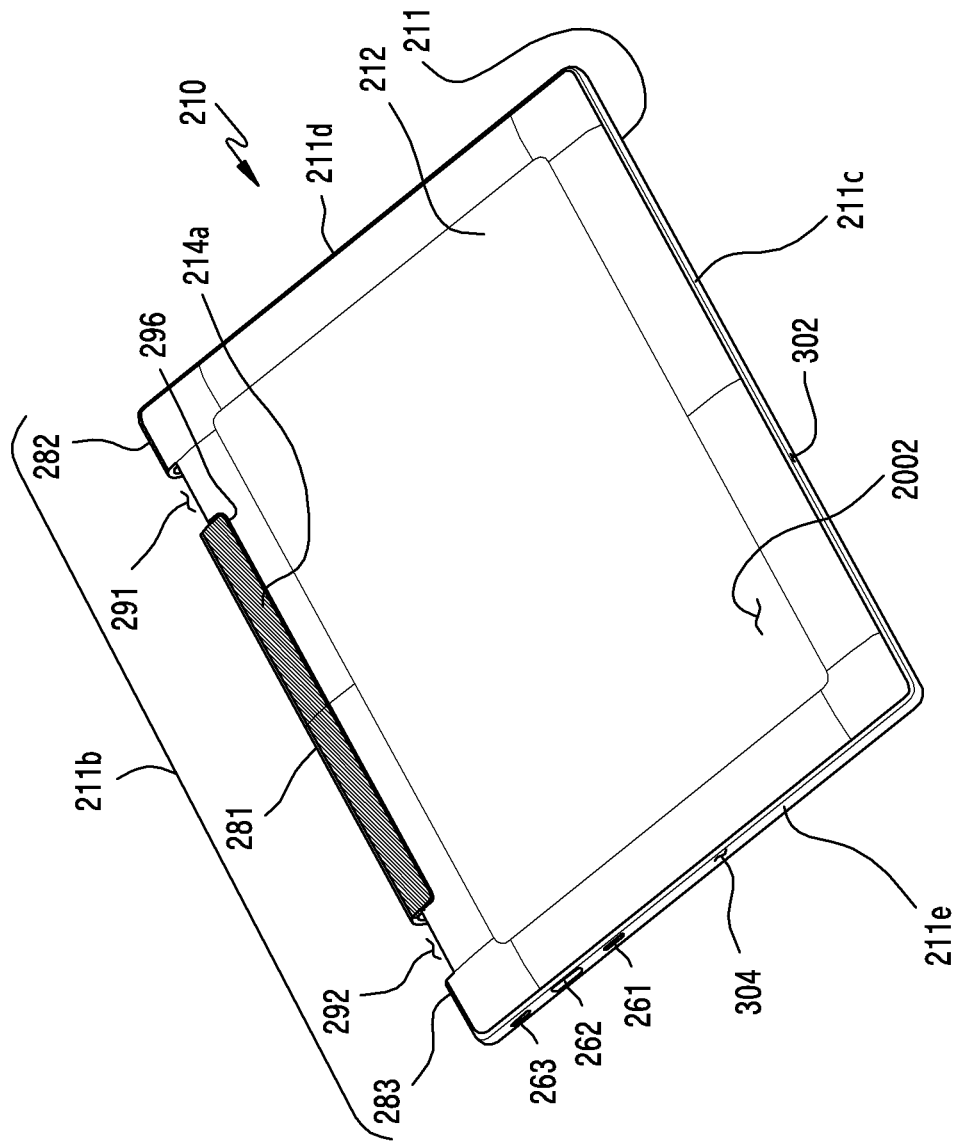
FIG. 7 is a rear perspective view of a first housing structure according to an embodiment.
Figure 8:
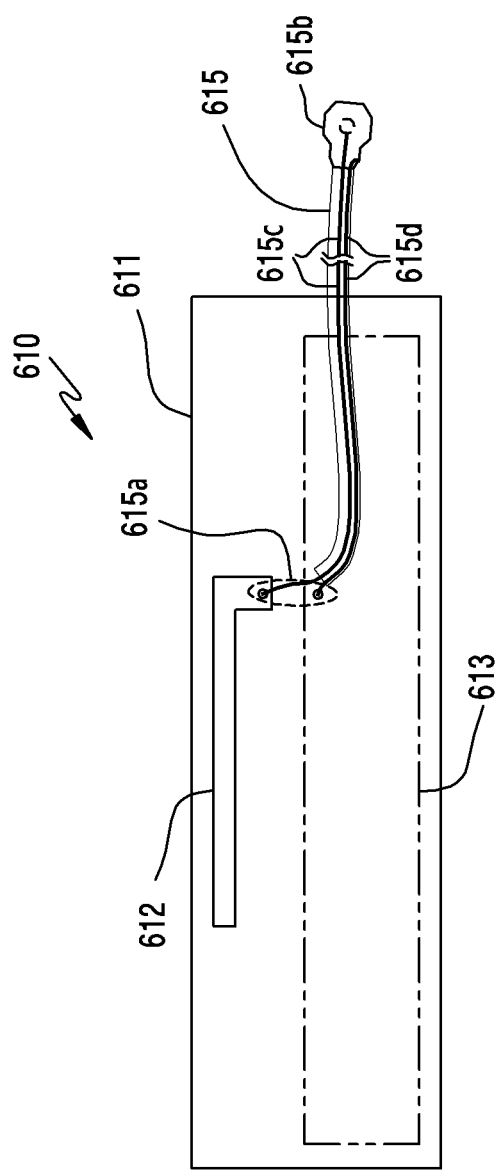
FIG. 8 illustrates an antenna according to an embodiment.
Figure 9:
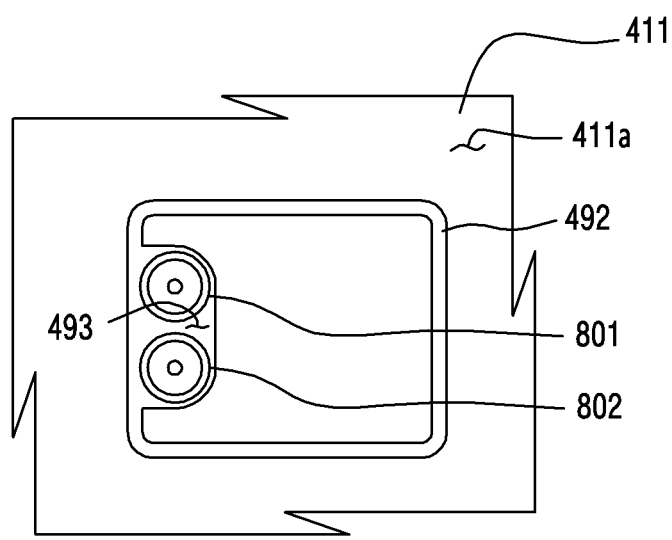
FIG. 9 illustrates a wireless communication module according to various embodiments.
Figure 10A:
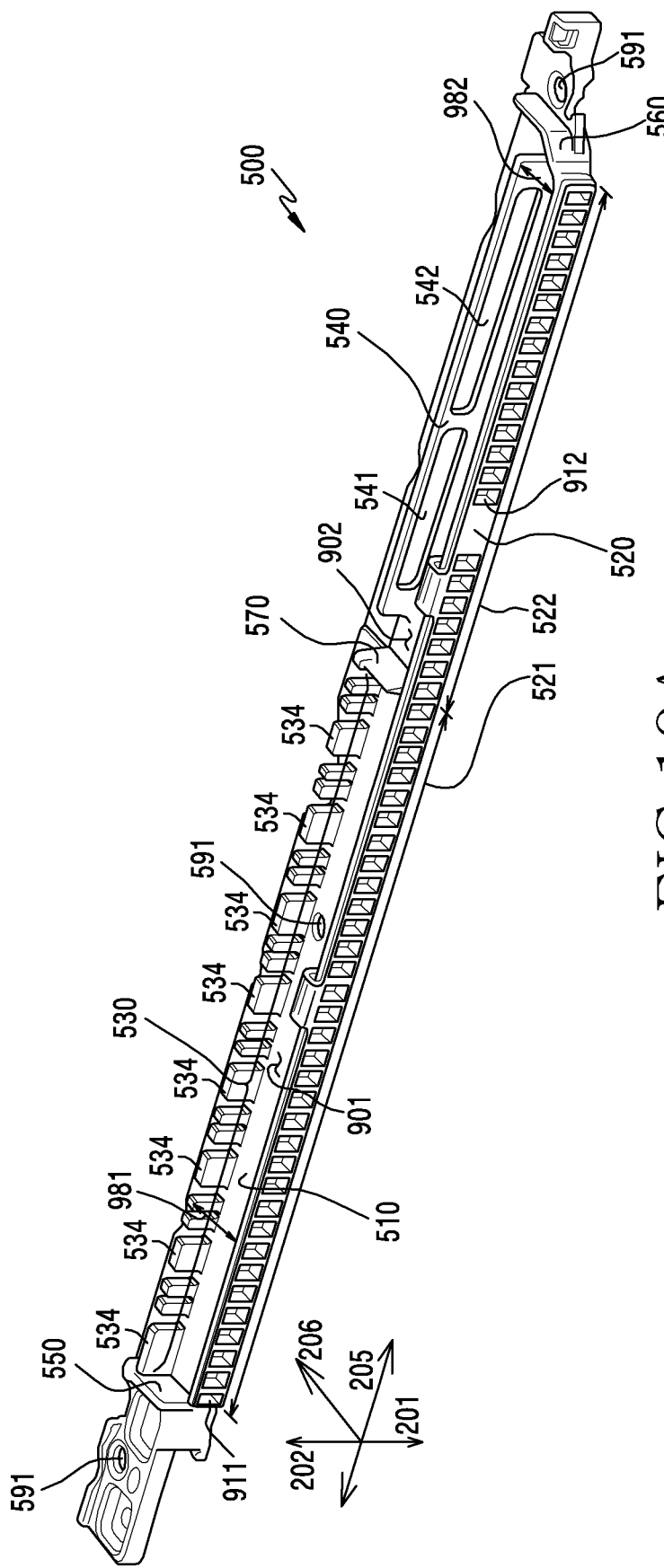
FIG. 10A is a perspective view of a support member according to an embodiment.
Figure 10B:
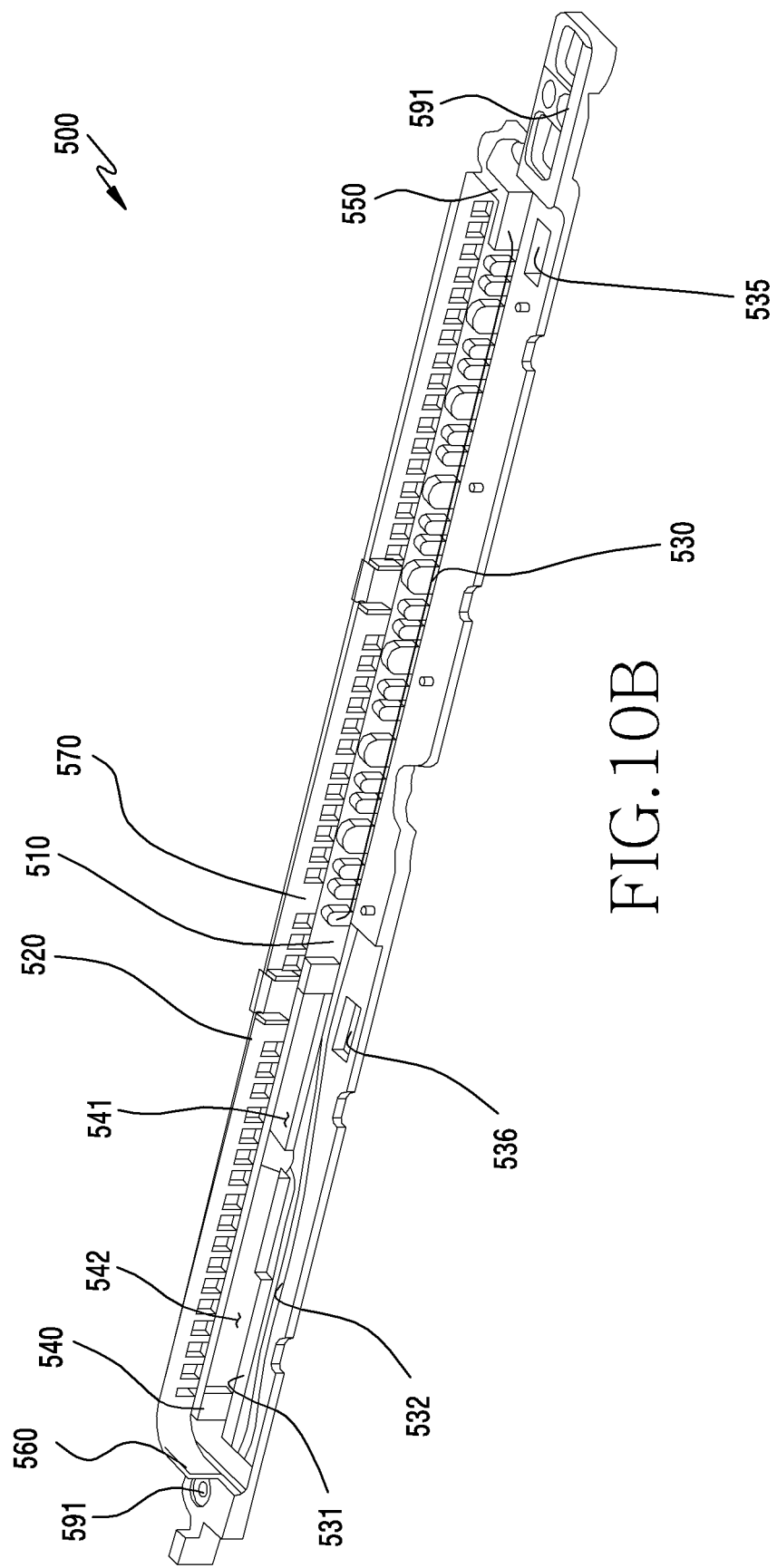
FIG. 10B is a perspective view of a support member according to an embodiment.
Figure 11:
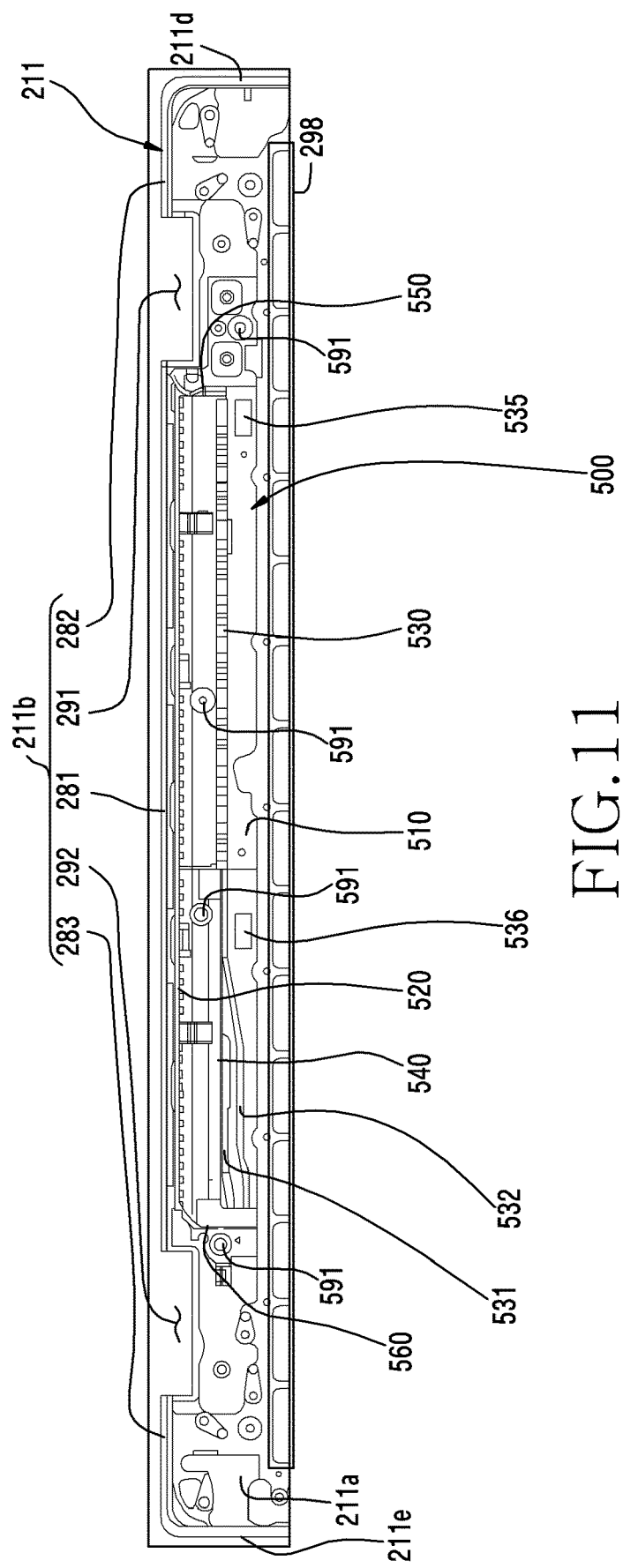
FIG. 11 illustrates a case and a support member according to an embodiment.
Figure 12:
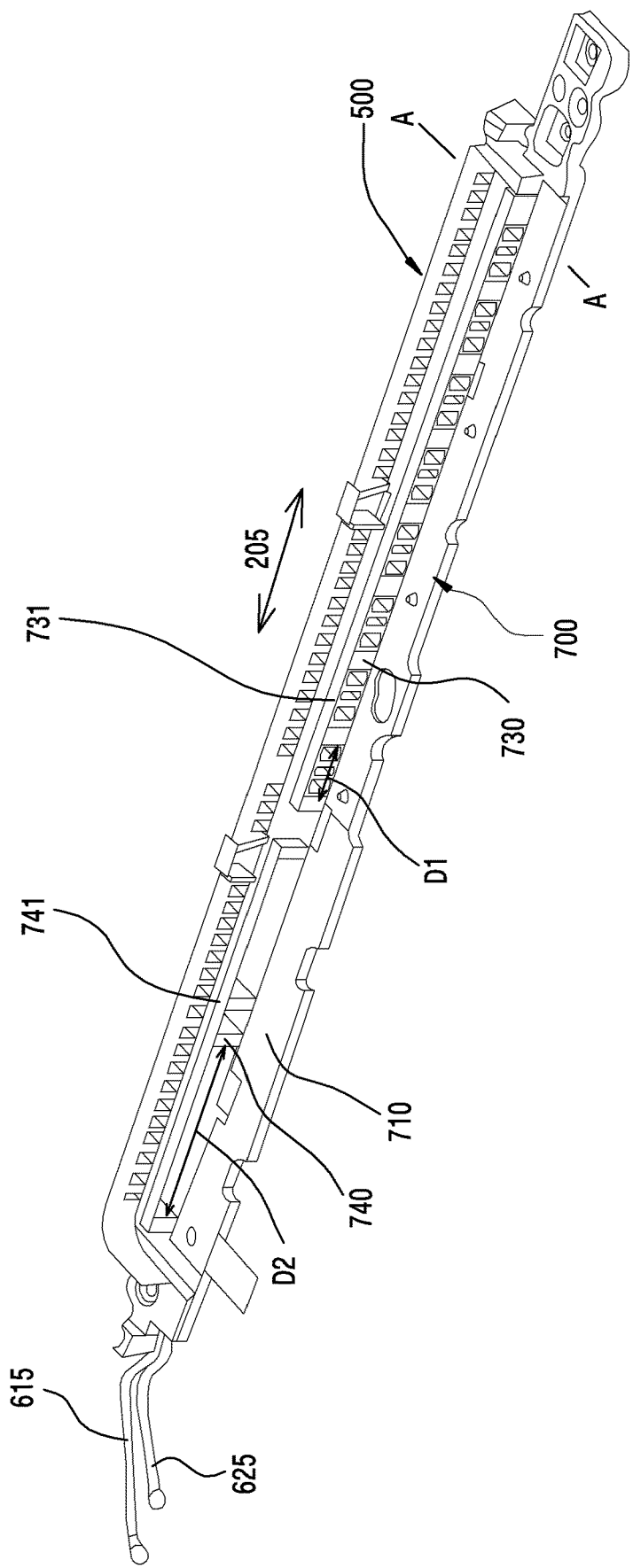
FIG. 12 illustrates a support member and a shield member according to an embodiment.
Figure 13:
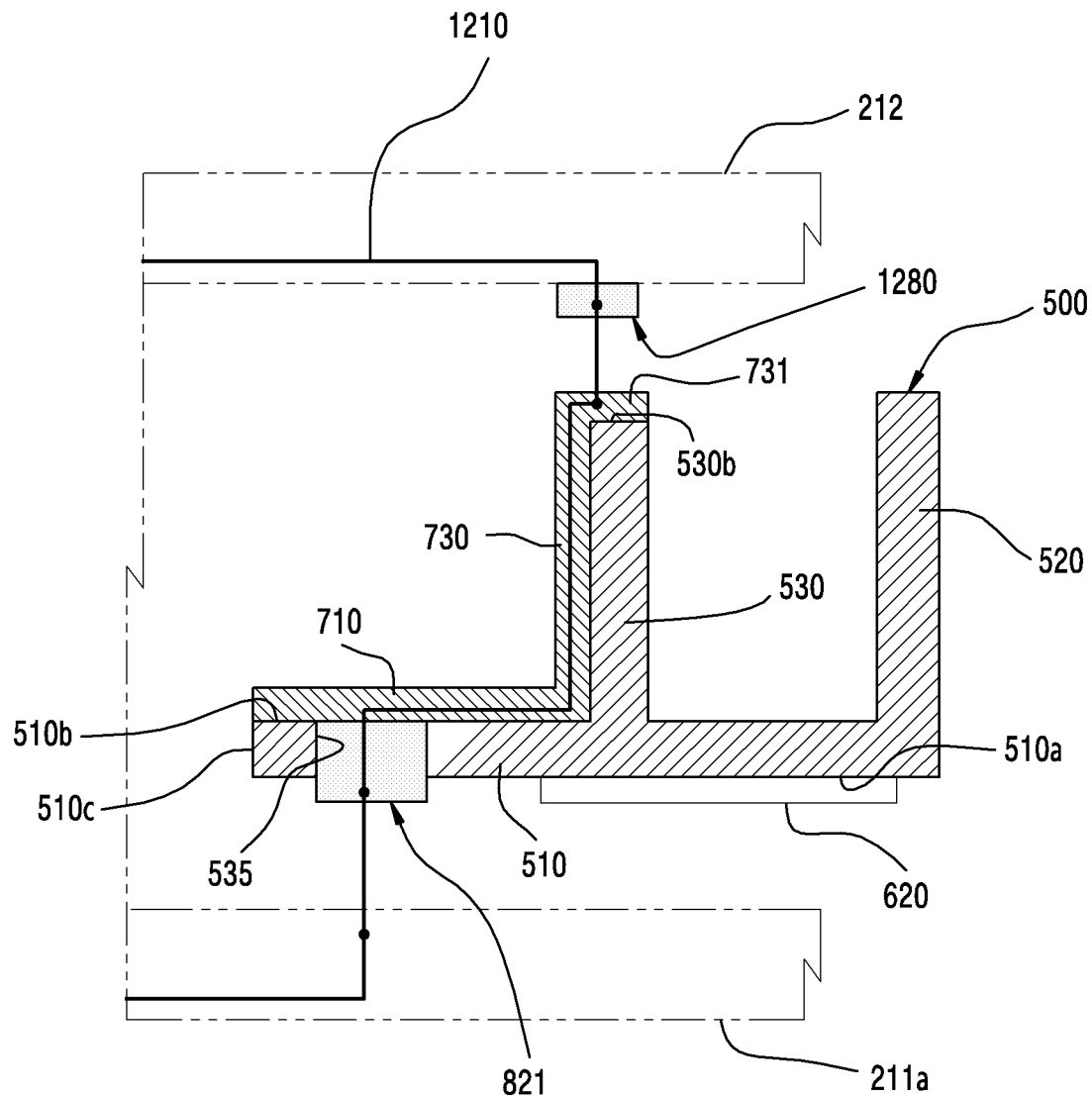
FIG. 13 is a schematic cross section of an A-A portion of FIG. 12 according to an embodiment.

FIG. 4 and FIG. 5 are exploded perspective views of the electronic device of FIG. 2 according to an embodiment. FIG. 6 is a diagram of a heat sink structure of the electronic device of FIG. 2 according to an embodiment. FIG. 7 is a rear perspective view of the first housing structure according to an embodiment. FIG. 8 illustrates an antenna according to an embodiment. FIG. 9 illustrates a wireless communication module according to various embodiments. FIGS. 10A and 10B are perspective views of a support member according to an embodiment. FIG. 11 illustrates a case and a support member according to an embodiment. FIG. 12 illustrates a support member and a shield member according to an embodiment. FIG. 13 is a schematic cross section of an A-A portion of FIG. 12 according to an embodiment.

Referring to FIG. 4 and FIG. 5, in an embodiment, the electronic device 200 can include the first housing structure 210, a first printed circuit board 411, a second printed circuit board 412, a blower 430, a heat conducting member 423, a support member 500, a first antenna 610, a second antenna 620, a first electrical path 615, a second electrical path 625, a shield structure 700, a first flexible conductive member 821 or a second flexible conductive member 822.

In an embodiment, referring to FIG. 4, FIG. 5 and FIG. 7, the first housing structure 210 can include a case (or a frame)

211 forming the first surface 2001, the first side surface 301, the second side surface 302, the third side surface 303 and the fourth side surface 304, and a second plate (e.g., a back cover) 212 forming at least a portion of the second surface 2002. The second plate 212 can be attachable to and/or detachable from the case 211. According to an embodiment, the case 211 and/or the second plate 212 can be formed of various metal materials such as aluminum.

In an embodiment, referring to FIG. 4, FIG. 5 and FIG. 7, the case 211 can include a first plate 211a forming the first surface 2001, a first side wall 211b forming the first side surface 301 and being vertical with the first plate 211a, a second side wall 211c forming the second side surface 302 and being vertical with the first plate 211a, a third side wall 211d forming the third side surface 303 and being vertical with the first plate 211a, or a fourth side wall 211e forming the fourth side surface 304 and being vertical with the first plate 211a.

According to an embodiment, at least a portion of the first side wall 211b can be a portion of the hinge structure for rotatably connecting with the second housing structure 220 of FIG. 2. For example, the first side wall 211b can include a first recess 291, a second recess 292, a first hinge arm 281, a second hinge arm 282 or a third hinge arm 283. The first hinge arm 281 can be disposed between the second hinge arm 282 and the third hinge arm 283. The first recess 291 can be disposed between the first hinge arm 281 and the second hinge arm 282, and can be a groove of a form of being dug in the sixth direction 206 going from the first side surface 301 to the second side surface (the second side surface 302 of FIG. 2). The second recess 292 can be disposed between the first hinge arm 281 and the third hinge arm 283, and can be a groove of a form of being dug in the sixth direction 206. For example, referring to FIG. 2 and FIG. 5, a fourth hinge arm 271 forming the one fifth side surface 305 in the second housing structure 220 can be fitted into the first recess 291 and be rotatably connected by the hinge structure with the first hinge arm 281 and/or the second hinge arm 282. Referring to FIG. 2 and FIG. 5, a fifth hinge arm 272 forming the other fifth side surface 305 in the second housing structure 220 can be fitted into the second recess 292 and be rotatably connected by the hinge structure with the first hinge arm 281 and/or the third hinge arm 283.

According to an embodiment, the first plate 211a of the case 211 can include a region (below, a keyboard disposition region) 298 where a plurality of through-holes are formed. The keyboard 240 can be disposed in a rear surface 2006 (e.g., a surface oriented opposite to the first surface 2001) of the first plate 211a, wherein a plurality of buttons of the keyboard 240 are inserted into the plurality of through-holes of the keyboard disposition region 298 and are exposed to the external.

According to an embodiment, the first printed circuit board 411 and the second printed circuit board 412 can be disposed between the first plate 211a and the second plate 212. For example, the first printed circuit board 411 and/or the second printed circuit board 412 can be coupled with the first plate 211a through various fastening means such as a bolt.

According to an embodiment, various parts such as a processor (e.g., the processor 120 of FIG. 1), a wireless communication module (e.g., the wireless communication module 192 of FIG. 1), and/or a power management module (e.g., the power management module 188 of FIG. 1) can be disposed in the first printed circuit board 411. According to an embodiment, various parts can be disposed in the second printed circuit board 412. For example, referring to FIG. 4 and FIG. 7, a first connector (not shown), a second connector 482 and a third connector 483 aligned in the connector holes 261, 262 and 263 can be disposed in the second printed circuit board 412. The first printed circuit board 411 and the second printed circuit board 412 can be electrically connected through various electrical paths such as a flexible printed circuit board (FPCB).

According to an embodiment, when viewed from above the first surface 2001, the first printed circuit board 411 and the second printed circuit board 412 can be disposed at least not to be overlapped. According to various embodiments (not shown), the first printed circuit board 411 and the second printed circuit board 412 can be formed as one printed circuit board as well.

According to an embodiment, the heat sink structure for externally releasing the heat radiated from the at least one part can be disposed inside the first housing structure 210. The heat sink structure can prevent the at least one part from being overheated. According to an embodiment, the first opening 310 can be formed in the first side wall 211b of the first housing structure 210. For example, the first opening 310 can be formed in the first hinge arm 281. The heat sink structure can allow the heat radiated from the at least one part (e.g., at least one part disposed in the first printed circuit board 411 or the second printed circuit board 412) disposed inside the first housing structure 210 to be released externally through the first opening 310.

Referring to FIG. 4 and FIG. 6, in an embodiment, the heat conducting member 421, 422 and 423 can include a first heat conducting member 421 receiving a heat radiated from at least one part, a third heat conducting member 423 disposed in alignment with the first opening 310, and a second heat conducting member 422 between the first heat conducting member 421 and the third heat conducting member 423. The heat radiated from the at least one part can be transferred to the first heat conducting member 421, and be moved to the third heat conducting member 423 through the second heat conducting member 422. According to an embodiment, the first heat conducting member 421 is disposed in the first printed circuit board 411 and thus, the heat radiated from the at least one part can be moved to the first heat conducting member 421. The first heat conducting member 421 can include at least a portion of a heat spreader of a patch form disposed in the first printed circuit board 411. By conduction in which a heat flows from a high temperature portion to a low temperature portion, the heat radiated from the at least one part can flow to the third heat conducting member 423 through the first heat conducting member 421 and the second heat conducting member 422. Convection heat transfer that is a scheme of energy transfer between a solid surface and a gas can work between the third heat conducting member 423 and air, and by this, the heat can be released externally through the first opening 310.

According to an embodiment, the second heat transfer member 422 can include a heat pipe or a vapor chamber.

According to an embodiment, the heat sink structure can include the blower 430 inducing the flow of air. The blower 430 can be connected with the third heat conducting member 423 (e.g., a heat sink) and, by the blower 430, air can be released externally through the first opening 310 via the third heat conducting member 423. A pressure difference between inside and outside the first housing structure 210 caused by the flow of air by the blower 430 can allow an external air to be introduced into the first housing structure 210 through the first opening 310. Owing to a forced convection by the blower 430, a convection heat transfer performance between the third heat conducting member 423 and air can be increased. The heat radiated from the at least one part can be transferred to the third heat conducting member 423 through the first heat conducting member 421 and the second heat conducting member 422.

Convection heat transfer that is a scheme of energy transfer between a solid surface and a gas can work between the third heat conducting member 423 and air, and by this, the heat can be released externally through the first opening 310.

According to an embodiment, when viewed from above the first surface 2001, there is the space (not shown) between the first printed circuit board 411 and the second printed circuit board 412, and at least a portion of the blower 430 can be disposed in the space.

According to an embodiment, the first opening 310 can be long extended in the fifth direction 205 (e.g., a direction perpendicular with the sixth direction 206) between the third side surface 303 and the fourth side surface 304. When viewed from above the first side surface 301, the first opening 310 can include a first partial opening 311 and a second partial opening 312 arranged in the fifth direction 205. The first partial opening 311 can be disposed closer to the first recess 291 than the second partial opening 312, and the second partial opening 312 can be disposed closer to the second recess 292 than the first partial opening 311.

According to an embodiment, when viewed from above the first side surface 301, the first partial opening 311 can be at least partially overlapped with the third heat transfer member 423. By the blower 430, air can be released externally through the second partial opening 312 of the first opening 310 via the third heat conducting member 423. Owing to the pressure difference between inside and outside the first housing structure 210 caused by the flow of air by the blower 430, an external air can be introduced into the first housing structure 210 through the first partial opening 311 of the first opening 310.

According to various embodiments (not shown), the first opening 310 can be replaced with a plurality of openings.

According to an embodiment, the support member 500 can be disposed inside the case 211 of the first housing structure 210 in adjacent with the first hinge arm 281. For example, the support member 500 can be coupled with the case 211 through various means such as a bolt and bonding materials. According to an embodiment, the support member 500 can be formed of non-conductive materials such as polymer.

In an embodiment, referring to FIG. 4, FIG. 5, FIG. 10A, FIG. 10B and FIG. 11, the support member 500 can include a third plate 510 facing the first plate 211a, and a fifth side wall 520 facing the first side wall 211b. The fifth side wall 520 can be a form of being protruded from the third plate 510 in the second direction 202 (e.g., the direction perpendicular with the fifth direction 205 and the sixth direction 206). According to an embodiment, when viewed in the sixth direction 206, the first side wall 520 can include a first partial side wall 521 at least partially overlapping with the first partial opening 311 of the first opening 310 of FIG. 5, and a second partial side wall 522 at least partially overlapping with the second partial opening 312 of the first opening 310. The first partial side wall 521 can be a structure in which a first through-hole 911 passing through in the sixth direction 206 is arranged in plurality in the fifth direction 205. The second partial side wall 522 can be a structure in which a second through-hole 912 passing through in the sixth direction 206 is arranged in plurality in the fifth direction 205.

According to various embodiments, some of the plurality of first through-holes 911 formed in the first partial side wall 521 can have different widths from some others in the fifth direction 205. According to various embodiments, at least two or more of the plurality of first through-holes 911 can have the same width in the fifth direction 205.

According to various embodiments, some of the plurality of second through-holes 912 formed in the second partial side wall 522 can have different widths from some others in the fifth direction 205. According to various embodiments, at least two or more of the plurality of second through-holes 912 can have the same width in the fifth direction 205.

According to various embodiments, some of the plurality of first through-holes 911 formed in the first partial side wall 521 can have the same or different widths from some of the plurality of second through-holes 912 formed in the second partial side wall 522, in the fifth direction 205.

According to various embodiments, the plurality of first through-holes 911 formed in the first partial side wall 521 can be substantially arranged at the same interval in the fifth direction 205. According to various embodiments, some of the plurality of first through-holes 911 can be arranged at different intervals from some others.

According to various embodiments, the plurality of second through-holes 912 formed in the second partial side wall 522 can be substantially arranged at the same interval in the fifth direction 205. According to various embodiments, some of the plurality of second through-holes 912 can be arranged at different intervals from some others.

According to various embodiments, some of the plurality of first through-holes 911 formed in the first partial side wall 521 can be arranged at the same or different intervals from some of the plurality of second through-holes 912 formed in the second partial side wall 522, in the fifth direction 205.

According to various embodiments, the plurality of first through-holes 911 formed in the first partial side wall 521 and/or the plurality of second through-holes 912 formed in the second partial side wall 522 can be formed at the same height (e.g., a width of the second direction 202 perpendicular with the fifth direction 205 and the sixth direction 206) from the third plate 510. According to various embodiments, some of the plurality of first through-holes 911 formed in the first partial side wall 521 or the plurality of second through-holes 912 formed in the second partial side wall 522 can have different heights from some others.

According to an embodiment, the support member 500 can include a sixth side wall 530 which faces the fifth side wall 520 and is spaced apart interposing a first space 901 therebetween in the sixth direction 206. The support member 500 can include a seventh side wall 540 which faces the fifth side wall 520 and is spaced apart interposing a second space 902 therebetween in the sixth direction 206. The sixth side wall 530 and/or the seventh side wall 540 can be a form of being protruded from the third plate 510 in the second direction 202.

According to an embodiment, a first distance 981 in which the sixth side wall 530 is spaced apart from the fifth side wall 520 can be greater than a second distance 982 in which the seventh side wall 540 is spaced apart from the fifth side wall 520. According to an embodiment, to secure a space for disposing the third heat transfer member 423 shown in FIG. 4 to face the seventh side wall 540, the second distance 982 can be less than the first distance 981. According to various embodiments (not shown), the first distance 981 and the second distance 982 can be formed variously.

According to an embodiment, the plurality of first through-holes 911 and second through-holes 912 formed in the fifth side wall 520 can be aligned with the first opening 310 of FIG. 4, to present a visual beauty through the first opening 310. The plurality of first through-holes 911 and second through-holes 912 formed in the fifth side wall 520 are not limited to the shown form and can be formed in various other forms.

According to an embodiment, the sixth side wall 530 can include a plurality of third partial side walls (not shown) protruded and extended from the third plate 510 in the second direction 202. Owing to a pressure difference between inside and outside the first housing structure 210 caused by the flow of air by the blower 430 of FIG. 4, an external air can be introduced into the first housing structure 210 through the second partial opening 312 of the first opening 310 and a gap between a plurality of third partial side walls included in the fifth side wall 520. According to various embodiments (not shown), the sixth side wall 530 can be formed in the form of having through-holes formed in the fifth side wall 520 or the seventh side wall 540 as well.

According to various embodiments, some of the plurality of third partial side walls included in the sixth side wall 530 can have different widths from some others in the fifth direction 205. According to various embodiments, at least two or more of the plurality of third partial side walls included in the sixth side wall 530 can have the same width in the fifth direction 205.

According to various embodiments, some of the plurality of third partial side walls included in the sixth partial side wall 530 can be arranged at different intervals from some others in the fifth direction 205. The interval of the fifth direction 205 between the third partial side walls can be formed variously.

According to various embodiments, the plurality of third partial side walls included in the sixth side wall 530 can be formed at the same height from the third plate 510. According to various embodiments, some of the plurality of third partial side walls can be formed at different heights from some others as well.

According to an embodiment, the seventh side wall 540 can include one or more fourth through-holes 541 and 542 passing through in the sixth direction 206. The seventh side wall 540 can be disposed facing the third heat transfer member 423 shown in FIG. 4. By the blower 430 of FIG. 4, air can be released externally through the one or more through-holes 541 and 542 of the seventh side wall 540 and the first opening 310 of FIG. 4 via the third heat transfer member 423.

According to various embodiments, the seventh side wall 540 can be formed to have openings (or through-holes) of various other forms capable of increasing an area where air passes, without being limited to the illustrated fourth through-holes 541 and 542, wherein air discharged from the blower 430 of FIG. 4 can easily pass through. For example, instead of the fourth through-holes 541 and 542, one through-hole can be formed to increase the area where air passes.

According to various embodiments, the area where air passes through the seventh side wall 540 can be greater than the area where air passes through the sixth side wall 530.

According to an embodiment, the support member 500 can include a barrier 570 of a form of being protruded from the third plate 510 in the second direction 202. The barrier 570 can be at least partially disposed between the first space 901 and the second space 902.

According to an embodiment, the support member 500 can include an eighth side wall 550 which is disposed to interpose the first space 901 and be spaced apart from the barrier 570 in the fifth direction. The first space 901 of a form of being dented in the first direction 201 can be formed by the third plate 510, the first partial side wall 521 of the first side wall 520, the sixth side wall 530, the eighth side wall 550 and the barrier 570.

According to an embodiment, the support member 500 can include a ninth side wall 560 which is disposed to interpose the first space 901 and be spaced apart from the barrier 570 in the fifth direction. The second space 902 of a form of being dented in the first direction 201 can be formed by the third plate 510, the second partial side wall 522 of the first side wall 520, the seventh side wall 540, the ninth side wall 560 and the barrier 570.

According to an embodiment, in response to the support member 500 being disposed in the first housing structure 210 of FIG. 4, the first space 901 can be restricted by the second plate 212. For example, the second plate 212 can at least partially come in touch with the first partial side wall 521 of the first side wall 520, the sixth side wall 530, the eighth side wall 550 or the barrier 570, and due to this, a structure having the first space 901 between the support member 500 and the second plate 212 as a passage can form a first duct (not shown) guiding the inhalation of an external air. According to an embodiment, the first duct can allow the external air introduced into the first partial opening 311 of the first opening 310 to substantially flow into the first housing structure 210 through a gap between the plurality of third partial side walls of the sixth side wall 530.

According to an embodiment, in response to the support member 500 being disposed in the first housing structure 210 of FIG. 4, the second space 902 can be restricted by the second plate 212. For example, the second plate 212 can at least partially come in touch with the second partial side wall 522 of the first side wall 520, the seventh side wall 540, the ninth side wall 560 or the barrier 570, and due to this, a structure having the second space 902 between the support member 500 and the second plate 212 as a passage can form a second duct (not shown) guiding the exhalation of an internal air. According to an embodiment, the second duct can allow the internal air introduced into one or more fourth through-holes of the seventh side wall 540 to substantially flow out of the first housing structure 210 through the first opening 310.

According to an embodiment, the third plate 510 can include a plurality of bolt holes 591 for bolts. The support member 500 can be coupled with the case 211 through the bolts.

Referring to FIG. 4 and FIG. 5, in an embodiment, the first antenna 610 and/or the second antenna 620 can be disposed in the support member 500. For example, the first antenna 610 and/or the second antenna 620 can be disposed in the third plate 510 of the support member 500 which faces the first plate 211a.

According to an embodiment, the one end part 615a of the first electrical path 615 can be electrically with the first antenna 610, and the other end part 615b of the first electrical path 615 can be electrically connected with the first printed circuit board 411. The one end part 625a of the second electrical path 625 can be electrically with the second antenna 620, and the other end part 625b of the second electrical path 625 can be electrically connected with the first printed circuit board 411.

According to an embodiment, the first antenna 610 and the second antenna 620 can be electrically connected with a wireless communication circuit (e.g., the wireless communication module 192 of FIG. 1) disposed in the first printed circuit board 411 and transmit and/or receive a signal having a selected or specified frequency.

In an embodiment, referring to FIG. 8, the first antenna 610 can include a flexible printed circuit board 611. The flexible printed circuit board 611 can include a first conductive pattern 612 and a second conductive pattern 613. According to an embodiment, the first conductive pattern 612 and the second conductive pattern 613 can be physically separated. The first electrical path 615 can include a first wiring 615c for electrically connecting the first conductive pattern 612 and the wireless communication module (e.g., the wireless communication module 192 of FIG. 1) disposed in the first printed circuit board 411, and a second wiring 615d for electrically connecting the second conductive pattern 613 and a ground (e.g., a ground layer or a ground plane) disposed in the first printed circuit board 411. According to an embodiment, the first conductive pattern 612 can be an antenna radiator, and the second conductive pattern 613 can be a ground plane. For example, in response to an emission current being presented to the first conductive pattern 612, the first conductive pattern 612 can be resonated with the second conductive pattern 613 and be operated as a radiating element.

According to an embodiment, the first electrical path 615 can be a coaxial cable. For example, the first wiring 615c can be a wiring disposed at the center of the coaxial cable. For example, the second wiring 615d can be a wiring which is disposed outside the first wiring 615c to be physically separated by insulating materials from the first wiring 615c in the coaxial cable. The one end part of the first wiring 615c can be electrically connected with the first conductive pattern 612 through conductive bonding materials such as a solder, and the other end part of the first wiring 615c can be electrically connected with a female connector for coaxial cable formed in the end part 615b of the first electrical path 615. The one end part of the second wiring 615d can be electrically connected with the second conductive pattern 613 through conductive bonding materials such as a solder, and the other end part of the second wiring 615d can be electrically connected with the female connector for coaxial cable. The female connector for coaxial cable can be electrically connected with a male connector for coaxial cable disposed in the first printed circuit board 411.

According to various embodiments, the second antenna 620 can substantially have the same structure as the first antenna 610, and a detailed description of this is omitted. The second electrical path 625 can substantially have the same structure as the first electrical path 615, and a detailed description of this is omitted.

According to an embodiment, an antenna system which utilizes the first antenna 610 and/or second antenna 620 and the second opening 320 and/or third opening 330 formed in the first plate 211a can utilize various frequency bands. For example, the frequency band can include a low band (LB) (about 600 to 1 GHz), a middle band (MB) (about 1 to 2.3 GHz), a high band (HB) (about 2.3 to 2.7 GHz), or an ultra high band (UHB) (about 2.7 to 6 GHz). The antenna system can further utilize other frequency bands as well.

According to an embodiment, the antenna system which utilizes the first antenna 610 and/or second antenna 620 and the second opening 320 and/or third opening 330 formed in the first plate 211a can transmit and/or receive a frequency signal of 2.4 GHz and/or a frequency signal of 5 GHz. According to various embodiments, the antenna system can transmit and/or receive a frequency signal for wireless fidelity (WiFi), 2-generation (2G), 3G; long term evolution (LTE), 5G or other various networks as well.

According to an embodiment, the antenna system which utilizes the first antenna 610 and/or second antenna 620 and the second opening 320 and/or third opening 330 formed in the first plate 211a can support at least one communication technique among single input multiple output (SIMO), multiple input single output (MISO), diversity or multiple input multiple output (MIMO).

In an embodiment, referring to FIG. 5, FIG. 10B and FIG. 11, the support member 500 can include a recess (or a through-hole part) 531 having a first wiring pattern for disposing the first electrical path 615 in the third plate 510. The first electrical path 615 can be disposed in the recess 531 along the first wiring pattern of the recess 531. The support member 500 can include a recess (or a through-hole part) 532 having a second wiring pattern for disposing the second electrical path 625 in the third plate 510. The second electrical path 625 can be disposed in the recess 532 along the second wiring pattern of the recess 532.

In various embodiments, referring to FIG. 9, a wireless communication module 492 (e.g., the wireless communication module 192 of FIG. 1) can be disposed in one surface 411a (e.g., a surface facing the first surface 2001 in FIG. 4, or a surface oriented in the first direction 201) of the first printed circuit board 411. The wireless communication module 492 can be an integrated circuit (IC) of a chip form capable of transmitting and/or receiving a signal having a selected or specified frequency, in various networks such as WiFi. According to an embodiment, the wireless communication module 492 can include a recess 493, and a first male connector for coaxial cable 801 and a second male connector for coaxial cable 802 disposed in the recess 493. The recess 493 can be a space of a form of being dug in a second direction (e.g., the second direction 202 of FIG. 2) oriented opposite to a first direction (e.g., the first direction 201 of FIG. 2) in which the one surface 411a is oriented, and in the first direction. The first male connector for coaxial cable 801 and the second male connector for coaxial cable 802 can be disposed in one surface of the recess 493 oriented in the first direction. According to an embodiment, the end part 615b (e.g., a female connector for coaxial cable) of the first electrical path 615 of FIG. 5 can be electrically connected with the first male connector for coaxial cable 801. The end part 625b (e.g., the female connector for coaxial cable) of the second electrical path 625 of FIG. 5 can be electrically connected with the second male connector for coaxial cable 802.

In various embodiments (not shown), the first conductive pattern 612 or the second conductive pattern 613 disposed in the support member 500 can be implemented in various other forms. For example, the first conductive pattern 612 or the second conductive pattern 613 can be implemented in the fifth surface 501 of the support member 500 in a scheme such as plating, printing, and SUS. For example, the first conductive pattern 612 or the second conductive pattern 613 disposed in the support member 500 can be implemented by laser direct structuring (LDS). For example, the LDS can be a scheme of sketching (or designing) a pattern in the support member 500 (e.g., a structure formed of resin such as polycarbonate) by using laser, and plating conductive materials such as copper or nickel thereon, to form a conductive pattern.

In an embodiment, referring to FIG. 8, a wireless communication module (e.g., the wireless communication module 192 of FIG. 1 or the wireless communication module 492 of FIG. 9) can forward an emission current (or a wireless signal) to the first conductive pattern 612 of the first antenna

610. The wireless communication module can forward an emission current to a conductive pattern (not shown) of the second antenna 620

Referring to FIG. 4 and FIG. 5, in an embodiment, the first antenna 610 and the second antenna 620 can be disposed facing the first plate 211*a* of the first housing structure 210. According to an embodiment, when viewed from above the first surface 2001, the first plate 211*a* can include the second opening 320 at least partially overlapping with the first antenna 610, and the third opening 330 at least partially overlapping with the second antenna 620. The second opening 320 can reduce the deterioration of antenna radiation performance of the first antenna 610 caused by the conductive first plate 211*a*. For example, the second opening 320 can reduce electrical influence (or electrical interference) that the conductive first plate 211*a* has on electromagnetic wave energy (or an electric field) released from the first antenna 610. The third opening 330 can reduce the deterioration of antenna radiation performance of the second antenna 620 caused by the conductive first plate 211*a*. For example, the third opening 330 can reduce electrical influence (or electrical interference) that the conductive first plate 211*a* has on electromagnetic wave energy (or an electric field) released from the second antenna 620.

According to various embodiments, because the conductive first plate 211*a* is disposed facing the first antenna 610 or the second antenna 620, capacitance (or a capacitance component or a parasitic capacitance component) can be provided, and a parasitic resonance frequency caused by the capacitance can be formed. According to an embodiment, the second opening 320 and/or the third opening 330 can adjust the parasitic resonance frequency wherein the parasitic resonance frequency is not included in a resonance frequency band of at least one antenna (e.g., the first antenna 610 and/or the second antenna 620). Owing to the second opening 320 and/or the third opening 330, the parasitic resonance frequency can move out of the resonance frequency band of the at least one antenna, and this can cause a decrease of the deterioration of antenna radiation performance caused by the parasitic resonance frequency.

According to various embodiments, a structure of the first plate 211*a* including the second opening 320 and/or the third opening 330 can operate as an additional antenna radiator capable of transmitting and/or receiving a signal having a selected or specified frequency, together with the first antenna 610 and/or the second antenna 620. For example, the structure of the first plate 211*a* including the second opening 320 and/or the third opening 330 can operate as a slot antenna radiator electromagnetically coupled with the first antenna 610 and/or the second antenna 620. According to an embodiment, the first antenna 610 and/or the second antenna 620 can be utilized as a feeding structure, and the structure of the first plate 211*a* including the second opening 320 and/or the second opening 330 can receive an emission current (or a wireless signal) indirectly from the first antenna 610 and/or the second antenna 620. In an embodiment, referring to FIG. 4, FIG. 5 and FIG. 7, the first conductive pattern 612 of the first antenna 610 can operate as a first feeding structure which at least partially overlaps with the second opening 320, when viewed from above the first surface 2001, and indirectly feeds the slot antenna radiator including the second opening 320. A conductive pattern (not shown) of the second antenna 620 can operate as a second feeding structure which at least partially overlaps with the third opening 330, when viewed from above the first surface 2001, and indirectly feeds the slot antenna radiator including the third opening 330.

According to various embodiments, the second opening 320 or the third opening 330 can be formed in various forms correspondingly to a selected or specified frequency.

In an embodiment, referring to FIG. 4, the second plate 212 can include a metal part 213 including conductive materials, and a non-metal part 214 including non-conductive materials (e.g., polymer) coupled with the metal part 213. Referring to FIG. 4 and FIG. 6, the metal part 213 can form at least a portion of the second surface 2002. According to an embodiment, when viewed from above the second surface 2002, the metal part 213 can include a notch 296 which is formed not to at least partially overlap with the first antenna 610 and/or the second antenna 620. For example, the notch 296 can be a form of being dug from the first side wall 211*b* to the second side wall 211*c*. According to various embodiments, the notch 296 can be replaced with an opening formed in the second plate 212 as well. According to an embodiment, the non-metal part 214 can be disposed to extend from a rear surface 2007 (e.g., a surface disposed opposite to the second surface 2002) of the second plate 212 to the notch 296. A portion 214*a* of the non-metal part 214 can be disposed in the notch 296 and form a portion of the second surface 2002.

According to an embodiment, the notch 296 of the second plate 212 can reduce the deterioration of antenna radiation performance of the first antenna 610 and/or the second antenna 620 caused by the conductive metal part 213. For example, the notch 296 can reduce electrical influence (or electrical interference) that the conductive metal part 213 has on electromagnetic wave energy (or an electric field) released from the first antenna 610 and/or the second antenna 620.

According to various embodiments, the non-metal part 214 can include hooks 214*b* disposed in the rear surface 2007 of the second plate 212 and snap-fit fastening with the case 211. The hooks 214*b* can be at least partially disposed along a frame of the second plate 212.

Referring to FIG. 5 and FIG. 12, in an embodiment, the shield structure (or a conductive member) 700 can be coupled with the support member 500. The shield structure 700 can be disposed in at least one surface of the support member 500. The shield structure 700 can be coupled with the support member 500 through various means such as a bolt or bonding materials (e.g., polymer).

According to an embodiment, the shield structure 700 can be electrically connected with the first plate 211*a* and the second plate 212 of FIG. 4, to prevent an electromagnetic noise from being forwarded to the antenna system utilizing the first antenna 610 and/or second antenna 620 and the second opening 320 and/or third opening 330 formed in the first plate 211*a*.

In an embodiment, referring to FIG. 10B and FIG. 12, the shield structure 700 can include a first conductive part 710 disposed in the third plate 510 of the support member 500, a second conductive part 730 disposed in the sixth side wall 530 of the support member 500, and a third conductive part 740 disposed in the seventh side wall 540 of the support member 500. According to an embodiment, the first conductive part 710, the second conductive part 730, and the third conductive part 740 can be formed integrally, and can include the same conductive materials.

For example, referring to FIG. 13, the first conductive part 710 can be at least partially disposed in a surface 510*b* which faces the second plate 212. According to various embodiments (not shown), the first conductive part 710 can be extended to a side surface 510*c* between a surface 510*a* facing the first plate 211*a* and a surface 510*b* facing the second plate 212. According to various embodiments (not shown), the first conductive part 710 can be extended to the surface 510*a* not to overlap with the second antenna 620 (or the first antenna 610 of FIG. 4) disposed in the surface 510*a* facing the first plate 211*a*.

In an embodiment, referring to FIG. 10B and FIG. 11, the third plate 510 can include at least one fourth opening 535 or 536. Referring to FIG. 13, the first flexible conductive member 821 can be disposed in the fourth opening 535 and physically get in contact with the first conductive part 710 of the shield structure 700. According to various embodiments, the first flexible conductive member 821 can be disposed in at least a portion of the first conductive part 710 exposed through the fourth opening 535. According to an embodiment, the first flexible conductive member 821 can physically get in contact with the first plate 211*a*. The shield structure 700 can be electrically connected with the first plate 211*a* through the first flexible conductive member 821. The second flexible conductive member 822 of FIG. 4 can be disposed in the fourth opening 536 in the substantially same scheme as the first flexible conductive member 821, and electrically connect the shield structure 700 and the first plate 211*a*.

In an embodiment, referring to FIG. 12 and FIG. 13, the second conductive part 730 can be extended from the first conductive part 710 and be disposed in the sixth side wall 530. According to an embodiment, the second conductive part 730 can include a portion 731 extended to one surface 530*b* of the sixth side wall 530 which faces the second plate 212. According to an embodiment, a third flexible conductive member 1280 can be disposed between the portion 731 and the second plate 212, and can electrically connect the shield structure 700 and the second plate 212. In FIG. 12, the third conductive part 740 of the shield structure 700 can be electrically connected with the second plate 212 in the substantially same scheme as the second conductive part 730.

According to various embodiments, the first flexible conductive member 821, the second flexible conductive member 822 or the third flexible conductive member 1280 can include a C-clip (e.g., a spring of a C form), pogo-pin, a spring, conductive PORON, a conductive rubber, a conductive tape or a cooper connector. The flexible conductive member can be implemented by various other members.

In an embodiment, referring to FIG. 13, in response to the shield structure 700 being electrically connected with the first plate 211*a* and the second plate 212, a shield space 1210 can be formed to prevent an electromagnetic noise from being forwarded from an electronic element (e.g., various elements disposed in the printed circuit boards 411 and 412 of FIG. 4 or electrically connected with the printed circuit boards 411 and 412) disposed inside the first housing structure 210 to the second antenna 620 (or the first antenna 610). Because of this, antenna radiation performance of the antenna system utilizing the second antenna 620 (or the first antenna 610) can be secured.

In an embodiment, referring to FIG. 10A, FIG. 10B and FIG. 12, the second conductive part 730 of the shield structure 700 can be disposed not to hide the space between the plurality of third partial side walls forming the sixth side wall 530. For example, the second conductive part 730 can be disposed in at least some 534 of the plurality of third partial side walls forming the sixth side wall 530 and be formed by a structure having a first interval (D1) in the fifth direction 205.

In an embodiment, referring to FIG. 12, the third conductive part 740 of the shield structure 700 can be disposed not to hide one or more fourth through-holes 541 and 542 forming the seventh side wall 540. For example, the third conductive part 740 can be formed by a structure having a second interval (D2) in the fifth direction 205.

According to an embodiment, the first interval (D1) or the second interval (D2) can be related with a length of a wavelength capable of shielding a noise of a selected or specified frequency in the antenna system utilizing the first antenna 610 and/or second antenna 620 and the second opening 320 and/or third opening 330 formed in the first plate 211*a*. For example, in response to the selected or specified frequency being 2.4 GHz, the second interval (D2) can be implemented as a wavelength length value (about 30 mm) of 2.4 GH, or a threshold value range. According to various embodiments, the antenna system can transmit and/or receive a frequency signal for WiFi, 2G, 3G LTE, 5G or other various networks, and the first interval (D1) or the second interval (D2) can be formed to have a wavelength length of a corresponding frequency.

Figure 14:
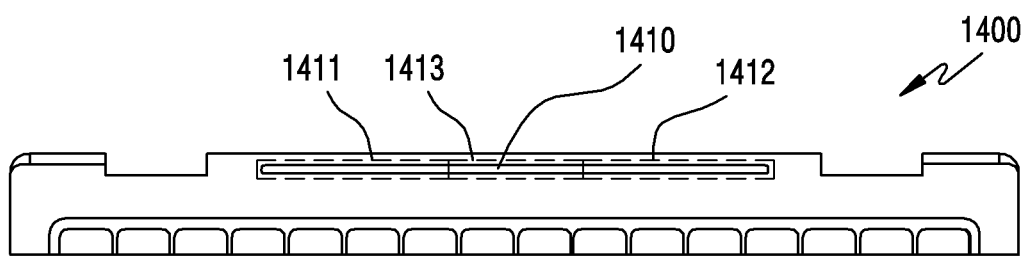
FIG. 14 illustrates a case of a first housing structure according to various embodiments.

FIG. 14 illustrates a case of a first housing structure according to various embodiments.

Referring to FIG. 14, in an embodiment, the case 1400 can be formed in a form of having one opening 1410 in place of the second opening 320 and the third opening 330 of FIG. 4. When the case 1400 of FIG. 14 is used instead of the case 211 of FIG. 4, according to an embodiment, a metal member (or a metal structure) (not shown) for separating a first region 1411 of the opening 1410 electromagnetically coupled with the first antenna 610 and a second region 1412 of the opening 1410 electromagnetically coupled with the second antenna 620 can be disposed in the support member 500 of FIG. 4. The metal member can at least partially overlap with the third region 1413 between the first region 1411 and the second region 1412.

According to various embodiments, an electronic device of various other rotating types (e.g., a slide type, a swivel type, etc.) in which at least two housings rotatably work by a connection part can be implemented by utilizing at least some of the second housing structure 220 including the first opening 310, the second opening 320 or the third opening 330 shown in FIG. 4, the support member 500, at least one antenna (e.g., the first antenna 610 and/or the second antenna 620), the blower 430 or various elements operatively connected with these.

According to various embodiments, the technological spirit of the present disclosure can be applied to an electronic device of a form such as a smart phone or a tablet personal computer (PC). The electronic device can include a housing (or a housing structure) which includes a first surface oriented in a first direction, a second surface oriented in a second direction opposite to the first direction, and a first side surface and a second side surface at least partially surrounding the space between the first surface and the second surface and oriented opposite to each other, and a third side surface and a fourth side surface perpendicular with the first side surface and oriented opposite to each other. The electronic device can include a display disposed along at least a portion of the first surface. According to an embodiment, the electronic device can include at least one antenna disposed near the first side surface in the housing structure, and at least one wireless communication module configured to transmit and/or receive a signal of a selected or specified frequency band through the at least one antenna. The electronic device can be implemented by utilizing at least some of the second housing structure 220 including the first opening 310, the second opening 320 or the third opening 330 shown in FIG. 4, the support member 500, at least one antenna (e.g., the first antenna 610 and/or the second antenna 620), the blower 430 or various elements operatively connected with these.

Figure 15:
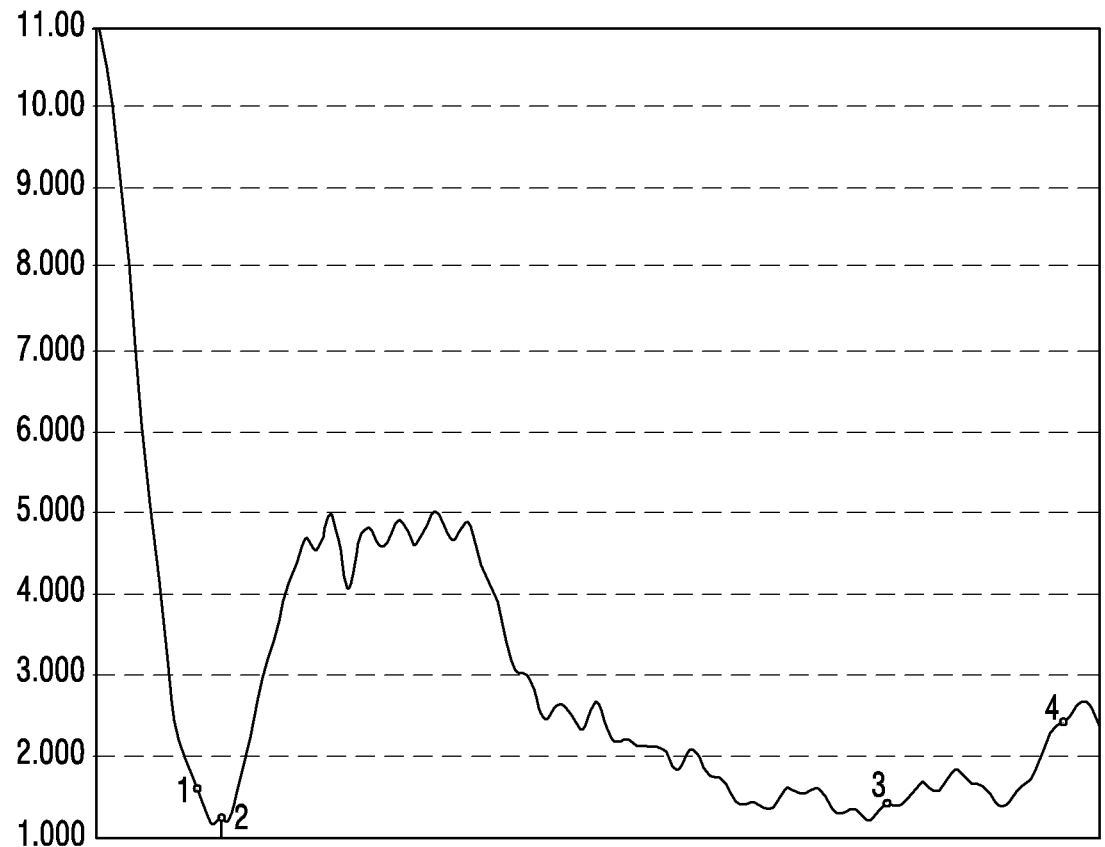
FIG. 15 is a graph illustrating a ratio of input voltage to output voltage on a frequency distribution of an antenna system included in the electronic device of FIG. 2 according to an embodiment.
Figure 16:
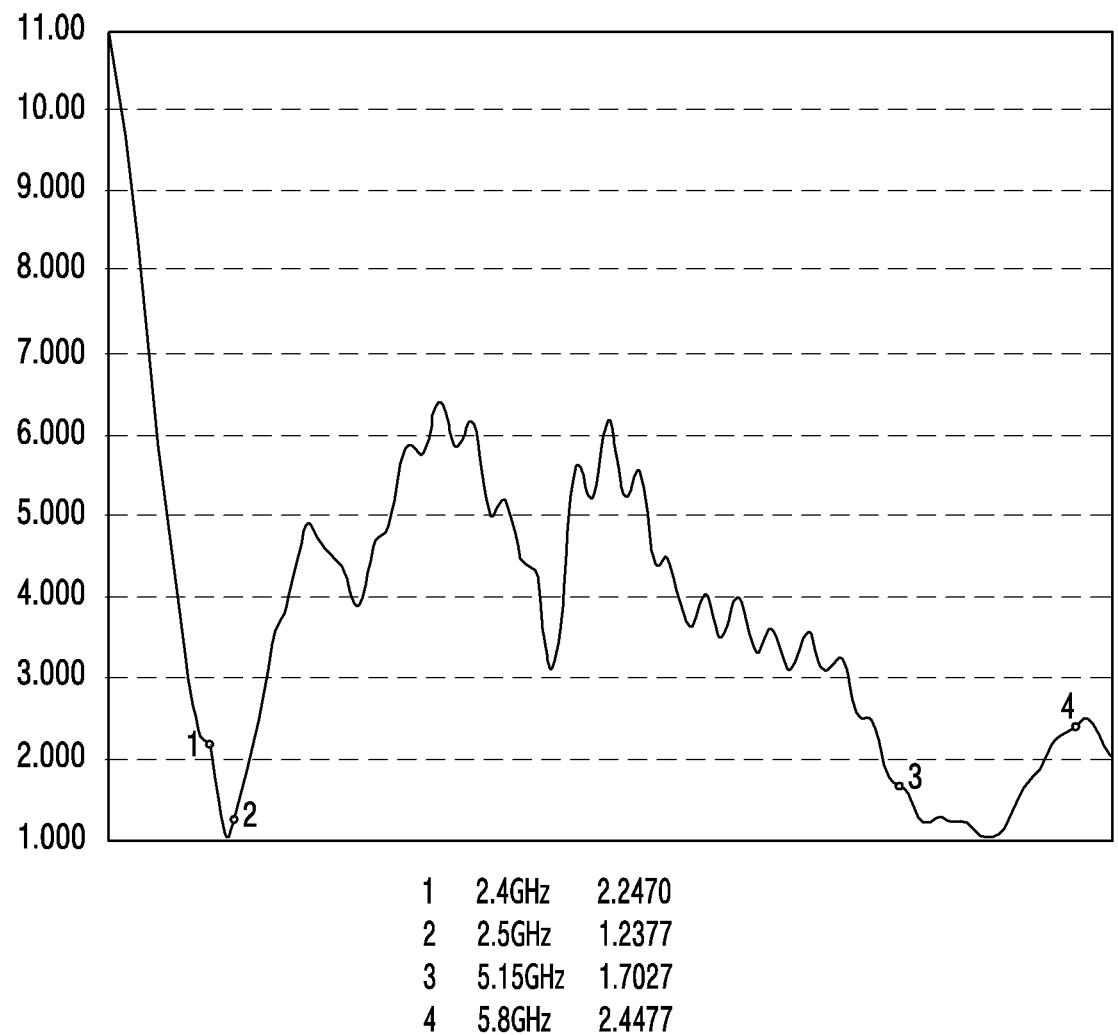
FIG. 16 is a graph illustrating a ratio of input voltage to output voltage on a frequency distribution of an antenna system which secures antenna radiation performance in a way of changing a metal portion at least partially surrounding an antenna into a non-metal portion.
Figure 17:
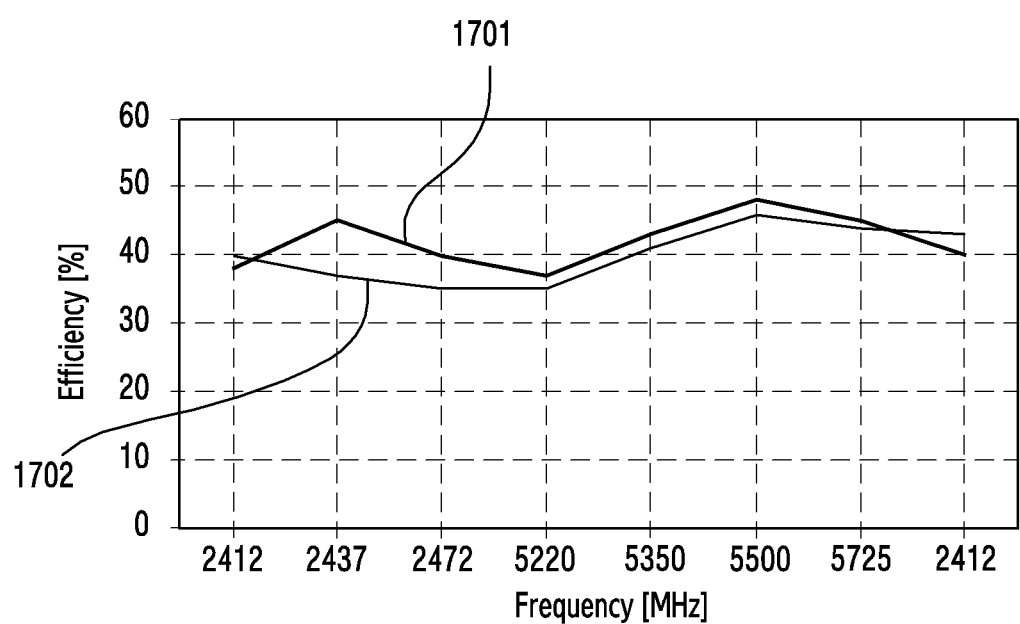
FIG. 17 is a graph illustrating the antenna radiation performance of a first antenna system and a second antenna system.

FIG. 15 is a graph illustrating a ratio (e.g., an S parameter) of input voltage to output voltage on a frequency distribution of an antenna system (below, a first antenna system) included in the electronic device of FIG. 2 according to an embodiment. FIG. 16 is a graph illustrating a ratio of input voltage to output voltage on a frequency distribution of an antenna system (below, a second antenna system) which secures antenna radiation performance in a way of changing a metal portion at least partially surrounding an antenna into a non-metal portion. FIG. 17 is a graph illustrating the antenna radiation performance of the first antenna system and the second antenna system. The second antenna system is merely prepared for comparison with the first antenna system according to an embodiment, and cannot have a preceding rank for the present invention. Referring to FIG. 17, reference numeral 1701 denotes the antenna radiation performance of the first antenna system, and reference numeral 1702 denotes the antenna radiation performance of the second antenna system.

Referring to FIG. 15, FIG. 16 and FIG. 17, the first antenna system included in the electronic device 200 of FIG. 2 can, though having the metal portion surrounding the at least one antenna, secure the antenna radiation performance in the selected or specified frequency (e.g., 2.4 GHz, 2.5 GHz, 5.1 GHz or 5.8 GHz) compared to the second antenna system.

According to various embodiments, the first antenna system can transmit and/or receive a frequency signal for WiFi, 2G, 3G, LTE, 5G or other various networks, and can secure the antenna performance in a selected or specified frequency for a corresponding network.

Figure 18:
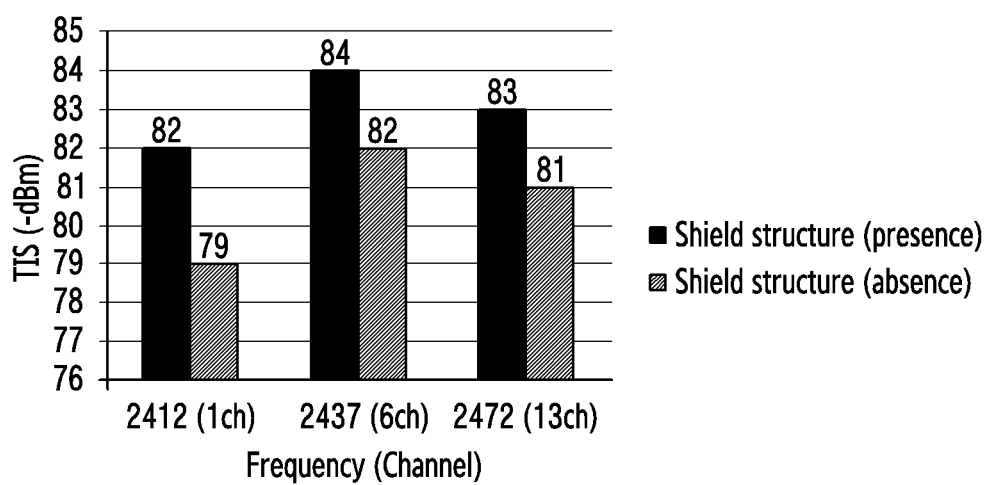
FIG. 18 is a graph of antenna performance dependent on the existence or non-existence of a shield structure according to an embodiment.

FIG. 18 is a graph of antenna performance (e.g., total isotropic sensitivity (TIS)) dependent on the existence or non-existence of a shield structure according to an embodiment.

Referring to FIG. 18, in response to the shield structure 700 of FIG. 7 not being applied, TIS can be deteriorated by about 2 dB. In response to the shield structure 700 being applied, the reception sensitivity can be increased.

According to an embodiment, an electronic device (e.g., the electronic device 200 of FIG. 2) can include a first housing structure (e.g., the first housing structure 210 of FIG. 2). The first housing structure can include a first surface (e.g., the first surface 2001 of FIG. 2) oriented in a first direction (e.g., the first direction 201 of FIG. 2), a second surface (e.g., the second surface 2002 of FIG. 2) oriented in a second direction (e.g., the second direction 202 of FIG. 2) opposite to the first direction, a first side surface (e.g., the first side surface 301 of FIG. 3) and a second side surface (e.g., the second side surface 302 of FIG. 2) surrounding at least a portion of the space between the first surface and the second surface and oriented opposite to each other, and a third side surface (e.g., the third side surface 303 of FIG. 2) and a fourth side surface (e.g., the fourth side surface 304 of FIG. 3) being perpendicular to the first side surface and oriented opposite to each other. The electronic device can include a second housing structure (e.g., the second housing structure 220 of FIG. 2). The second housing structure can include a third surface (e.g., the third surface 2003 of FIG. 2) oriented in a third direction (e.g., the third direction 203 of FIG. 2), a fourth surface (e.g., the fourth surface 2004 of FIG. 3) oriented in a fourth direction (e.g., the fourth direction 204 the of FIG. 2) opposite to the third direction, a fifth side surface and a sixth side surface surrounding at least a portion of the space between the third surface and the fourth surface and oriented opposite to each other, and a seventh side surface (e.g., the seventh side surface 307 of FIG. 2) and an eighth side surface (e.g., the eighth side surface 308 of FIG. 3) being perpendicular to the fifth side surface and oriented opposite to each other. The electronic device can include a hinge structure connecting between the first side surface and the fifth side surface. The electronic device can include a display (e.g., the display of FIG. 2) disposed along at least a portion of the third surface. The electronic device can include at least one antenna (e.g., the first antenna 610 and/or the second antenna 620 of FIG. 4) disposed near the first side surface inside the first housing structure. The electronic device can include at least one wireless communication module (e.g., the wireless communication module 192 of FIG. 1) configured to transmit and/or receive a signal in a selected or specified frequency band through the at least one antenna.

According to an embodiment, the electronic device can further include a non-conductive support member (e.g., the support member 500 of FIG. 4) disposed in adjacent to the first side surface inside the first housing structure. The at least one antenna (e.g., the first antenna 610 and/or second antenna 620 of FIG. 4) can be disposed in one surface of the support member facing the first surface.

According to an embodiment, the first housing structure can include a metallic first plate (e.g., the first plate 211a of FIG. 4) forming the first surface. The first plate can include at least one opening (e.g., the second opening 320 and/or third opening 330 of FIG. 4) at least partially overlapping with the at least one antenna when viewed from above the first surface.

According to an embodiment, the first housing structure can include a second plate (e.g., the second plate 212 of FIG. 4) forming the second surface. A partial region (e.g., the portion 214a of the non-metal part 214 of FIG. 7) of the second plate at least partially overlapping with the at least one antenna when viewed from above the second surface can be formed of non-conductive materials.

According to an embodiment, the first housing structure can include a first opening (e.g., the first opening 310 of FIG. 4) formed in the first side surface. The first housing structure can further include a plurality of through-holes formed in the support member (e.g., the support member 500 of FIG. 4) to at least partially overlap with the first opening when viewed from above the first side surface.

According to an embodiment, the electronic device can further include a heat sink (e.g., the third heat transfer member 423 of FIG. 4) at least partially overlapping with the plurality of through-holes when viewed from above the first side surface.

According to an embodiment, the support member can include a plate (e.g., the third plate 510 of FIG. 10A) disposed facing the first surface, and disposing the at least one antenna. The support member can include a side wall (e.g., the fifth side wall 520, the sixth side wall 530, and/or the seventh side wall 540 of FIG. 10A) disposed facing the first side surface, and including the plurality of through-holes.

According to an embodiment, the first housing structure can include a metallic first plate (e.g., the first plate 211a of FIG. 4) forming the first surface. The second housing structure can include a metallic second plate (e.g., the second plate 212 of FIG. 4) forming the second surface. The electronic device can further include a conductive member (e.g., the shield structure 700 of FIG. 5) electrically connected with the first plate and the second plate and disposed in the support member.

According to an embodiment, the conductive member (e.g., the shield structure 700 of FIG. 5) can include a plurality of second through-holes formed in a portion extended to between the first opening (e.g., the first opening 310 of FIG. 5) and the plurality of through-holes. At least some of the plurality of second through-holes can be formed to have resonance lengths for the selected or specified frequency band.

According to an embodiment, the electronic device can further include a first flexible conductive member (e.g., the first flexible conductive member 821 and/or second flexible conductive member 822 of FIG. 4 or 13) disposed in the through-hole formed in the support member and electrically connecting with the first plate and the conductive member. The electronic device can further include a second flexible conductive member (e.g., the flexible conductive member 1280 of FIG. 13) disposed between the second plate and the conductive member.

According to an embodiment, the electronic device can further include at least one electrical path (e.g., the first electrical path 615 and/or second electrical path 625 of FIG. 5) electrically connecting the at least one antenna and the wireless communication module. The at least one electrical path can be disposed in a recess (e.g., the recess 531 or 532 of FIG. 12) having a wiring pattern, formed in the support member.

According to an embodiment, the first housing structure can include an integral metallic case (e.g., the case 211 of FIG. 4) forming the first surface, the first side surface, the second side surface, the third side surface and the fourth side surface. The first housing structure can include a metallic cover (e.g., the second plate 212 of FIG. 4) forming the second surface.

According to an embodiment, the at least one antenna can include a flexible printed circuit board (e.g., the flexible printed circuit board 611 of FIG. 8) including a first conductive pattern (e.g., the first conductive pattern 612 of FIG. 8) and a second conductive pattern (e.g., the second conductive pattern 613 of FIG. 8) physically separated. The first conductive pattern can be electrically connected with the wireless communication module. The second conductive pattern can be electrically connected with a ground plane disposed inside the first housing structure.

According to an embodiment, the electronic device can further include a keyboard (e.g., the keyboard 240 of FIG. 2) disposed in the second surface.

According to an embodiment, an electronic device can include a housing (e.g., the first housing structure 210 of FIG. 2) including a first surface (e.g., the first surface 2001 of FIG. 2) oriented in a first direction, a second surface (e.g., the second surface 2002 of FIG. 2) oriented in a second direction opposite to the first direction, a first side surface (e.g., the first side surface 301 of FIG. 3) and a second side surface (e.g., the second side surface 302 of FIG. 2) surrounding at least a portion of the space between the first surface and the second surface and oriented opposite to each other, and a third side surface (e.g., the third side surface 303 of FIG. 2) and a fourth side surface (e.g., the fourth side surface 304 of FIG. 3) being perpendicular to the first side surface and oriented opposite to each other. The electronic device can include a display disposed along at least a portion of the first surface. The electronic device can include at least one antenna (e.g., the first antenna 610 and/or the second antenna 620 of FIG. 4) disposed near the first side surface inside the housing. The electronic device can include at least one wireless communication module configured to transmit and/or receive a signal in a selected or specified frequency band through the at least one antenna. The housing can include a metallic first plate (e.g., the first plate 211*a* of FIG. 4) forming at least a portion of the first surface. The first plate can include at least one first opening (e.g., the second opening 320 and/or third opening 330 of FIG. 4) at least partially overlapping with the at least one antenna when viewed from above the first surface.

According to an embodiment, the electronic device can further include a non-conductive support member (e.g., the support member 500 of FIG. 4) disposed in adjacent to the first side surface inside the housing. The at least one antenna can be disposed in one surface of the support member facing the first surface.

According to an embodiment, the housing can include a metallic second plate (e.g., the second plate 212 of FIG. 4) forming at least a portion of the second surface. The electronic device can further include a conductive member (e.g., the shield structure 700 of FIG. 5) electrically connecting with the first plate and the second plate and disposed in the support member.

According to an embodiment, the electronic device can include a second opening (e.g., the first opening 310 of FIG. 4) formed in the first side surface. The electronic device can further include a plurality of through-holes formed in the support member to at least partially overlap with the second opening when viewed from above the first side surface. The electronic device can further include a heat sink (e.g., the third heat conducting member 423 of FIG. 4) at least partially overlapping with the plurality of through-holes when viewed from above the first side surface.

According to an embodiment, an antenna structure can include, as a non-conductive support member, a support member (e.g., the support member 500 of FIG. 10A) including a plate (e.g., the third plate 510 of FIG. 10A), and a first side wall (e.g., the fifth side wall 520 of FIG. 10A) vertical with the plate and including a plurality of first through-holes. The antenna structure can include at least one antenna (e.g., the first antenna 610 and/or second antenna 620 of FIG. 4) disposed in the plate. The antenna structure can include a conductive member (e.g., the shield structure 700 of FIG. 12) physically separated from the at least one antenna and disposed in the support member and including a plurality of second through-holes aligned with the plurality of first through-holes.

According to an embodiment, the antenna structure can further include a second side wall (e.g., the sixth side wall 530 and/or seventh side wall 540 of FIG. 10A) vertical with the plate and disposed facing the first side wall. The second side wall can include a plurality of third through-holes at least partially overlapping with the plurality of first through-holes when viewed from above the first side wall.

Various embodiments disclosed in the specification and drawings just merely suggest specific examples so as to easily explain the technological content of an embodiment of the present disclosure and assist the understanding of the embodiment of the present disclosure, and do not intend to limit the scope of the embodiment of the present disclosure. Accordingly, the scope of various embodiments of the present disclosure should be construed as including all modified or changed forms drawn on the basis of the technological spirit of the various embodiments of the present disclosure, besides embodiments disclosed herein.

The invention claimed is:

1. An electronic device comprising:
a first housing structure comprising a first surface oriented in a first direction, a second surface oriented in a second direction opposite to the first direction, and a first side surface substantially orthogonal to the first surface and the second surface, wherein the first surface comprises a metallic plate with at least one opening, the metallic plate forming the first surface;
a keyboard disposed in the first surface;
at least one antenna disposed near the first side surface inside the first housing structure under the metallic plate wherein the at least one opening at least partially overlaps the at least one antenna, the at least one antenna including at least one radiator disposed on a plane substantially parallel to the first surface and wherein the at least one antenna is configured to use a portion of the metallic plate with the at least one opening as an additional radiator;
a second housing structure comprising a third surface oriented in a third direction, a fourth surface oriented in a fourth direction opposite to the third direction, and a second side surface substantially orthogonal to the third surface and the fourth surface;
a display disposed along at least a portion of the third surface of the second housing structure;
a hinge structure connecting between the first side surface and the second side surface; and
at least one wireless communication module configured to transmit and/or receive a signal in a selected or specified frequency band through the at least one antenna.

2. The electronic device of claim 1, further comprising a support member, the support member being non-conductive and disposed adjacent to the first side surface inside the first housing structure,
wherein the at least one antenna is disposed in one surface of the support member facing the first surface.

3. The electronic device of claim 2, wherein the first housing structure comprises a second plate forming the second surface, and
a partial region of the second plate at least partially overlapping with the at least one antenna when viewed from above the second surface is formed of non-conductive materials.

4. The electronic device of claim 2, further comprising:
a first opening formed in the first side surface; and
a plurality of through-holes formed in the support member to at least partially overlap with the first opening when viewed from above the first side surface, and
wherein the at least one opening includes a second opening formed in the first surface and a third opening formed in the first surface.

5. The electronic device of claim 4, further comprising a heat sink at least partially overlapping with the plurality of through-holes when viewed from above the first side surface.

6. The electronic device of claim 4, wherein the support member comprises:
a plate disposed facing the first surface, wherein the at least one antenna is disposed on the plate; and
a side wall disposed facing the first side surface, and comprising the plurality of through-holes.

7. The electronic device of claim 5, wherein
the second housing structure comprises a metallic second plate forming the second surface, and
the electronic device further comprises a conductive member electrically connected with the metallic plate and the metallic second plate and disposed in the support member.

8. The electronic device of claim 7, wherein the conductive member comprises a plurality of second through-holes formed in a portion extended to between the first opening and the plurality of through-holes, and
at least some of the plurality of second through-holes are formed to have resonance lengths for the selected or specified frequency band.

9. The electronic device of claim 7, further comprising:
a first flexible conductive member disposed in the plurality of through-holes formed in the support member, and electrically connecting with the metallic plate and the conductive member; and
a second flexible conductive member disposed between the metallic second plate and the conductive member.

10. The electronic device of claim 2, further comprising at least one electrical path electrically connecting the at least one antenna and the at least one wireless communication module,
wherein the at least one electrical path is disposed in a recess having a wiring pattern, formed in the support member.

11. The electronic device of claim 1, wherein the first housing structure comprises:
an integral metallic case forming the first surface, the first side surface, a second side surface substantially parallel to the first side surface, a third side surface substantially orthogonal to the first side surface and the second side surface and a fourth side surface substantially parallel to the third side surface; and
a metallic cover forming the second surface.

12. The electronic device of claim 1, wherein the at least one radiator comprises a first conductive pattern and the at least one antenna comprises a flexible printed circuit board comprising a second conductive pattern physically separated from the first conductive pattern,
the first conductive pattern is electrically connected with the at least one wireless communication module, and
the second conductive pattern is electrically connected with a ground plane disposed inside the first housing structure.

* * * * *